US010580759B2

(12) United States Patent
Jo et al.

(10) Patent No.: US 10,580,759 B2
(45) Date of Patent: Mar. 3, 2020

(54) FAN-OUT SEMICONDUCTOR PACKAGE

(71) Applicant: SAMSUNG ELECTRONICS CO., LTD., Suwon-si (KR)

(72) Inventors: Eun Jung Jo, Suwon-Si (KR); Han Kim, Suwon-Si (KR); Yoon Seok Seo, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/152,237

(22) Filed: Oct. 4, 2018

(65) Prior Publication Data

US 2019/0267351 A1 Aug. 29, 2019

(30) Foreign Application Priority Data

Feb. 26, 2018 (KR) .......................... 10-2018-0023023

(51) Int. Cl.
*H01L 25/065* (2006.01)
*H01L 23/498* (2006.01)
*H01L 23/00* (2006.01)
*H01L 23/31* (2006.01)

(52) U.S. Cl.
CPC ...... *H01L 25/0657* (2013.01); *H01L 23/3128* (2013.01); *H01L 23/49822* (2013.01);
(Continued)

(58) Field of Classification Search
CPC . H01L 25/0657; H01L 23/3128; H01L 24/73; H01L 24/32; H01L 24/08;
(Continued)

(56) References Cited

U.S. PATENT DOCUMENTS

2008/0169548 A1  7/2008  Baek
2009/0127686 A1*  5/2009  Yang ...................... H01L 24/82
257/686

(Continued)

FOREIGN PATENT DOCUMENTS

JP       2007/150154 A      6/2007
KR   10-1999-0069447 A      9/1999
(Continued)

OTHER PUBLICATIONS

Taiwanese Office Action dated Mar. 13, 2019 issued in Taiwanese Patent Application No. 107134834 (with English translation).
(Continued)

*Primary Examiner* — Jasmine J Clark
(74) *Attorney, Agent, or Firm* — Sughrue Mion, PLLC

(57) ABSTRACT

A fan-out semiconductor package includes a first core member including a first through-hole, a first semiconductor chip disposed in the first through-hole of the first core member, a first encapsulant configured to encapsulate at least a portion of the first semiconductor chip, a first connection member disposed on the first semiconductor chip and including a first redistribution layer, a second core member adhered to a lower surface of the first connection member and including a second through-hole, a second semiconductor chip disposed in the second through-hole of the second core member, a second encapsulant configured to encapsulate the second semiconductor chip, the second core member, and the first connection member, a second connection member disposed on the second semiconductor chip and including a second redistribution layer, and a connection via penetrating through the second core member and configured to electrically connect the first redistribution layer and the second redistribution layer.

24 Claims, 15 Drawing Sheets

(52) U.S. Cl.
CPC ........ *H01L 23/49827* (2013.01); *H01L 24/08* (2013.01); *H01L 24/32* (2013.01); *H01L 24/73* (2013.01); *H01L 2224/08235* (2013.01); *H01L 2224/18* (2013.01); *H01L 2224/32225* (2013.01); *H01L 2224/73251* (2013.01); *H01L 2225/06548* (2013.01)

(58) Field of Classification Search
CPC ......... H01L 23/49827; H01L 23/49822; H01L 2224/18; H01L 2224/32225; H01L 2224/08235; H01L 2225/06548; H01L 2224/73251; H01L 24/19
USPC ................ 257/686, 777, E25.006, E25.021, 257/E25.027, E23.085; 438/109
See application file for complete search history.

(56) References Cited

U.S. PATENT DOCUMENTS

| | | |
|---|---|---|
| 2013/0241042 A1 | 9/2013 | Kwon |
| 2013/0249101 A1 | 9/2013 | Lin et al. |
| 2016/0336296 A1 | 11/2016 | Jeong et al. |
| 2017/0033080 A1 | 2/2017 | Chen et al. |
| 2017/0033083 A1 | 2/2017 | Lin et al. |
| 2017/0103951 A1 | 4/2017 | Lee et al. |

FOREIGN PATENT DOCUMENTS

| | | |
|---|---|---|
| KR | 10-2012-0040619 A | 4/2012 |
| KR | 10-2016-0134435 A | 11/2016 |
| KR | 10-2017-0043440 A | 4/2017 |
| TW | 201342502 A | 12/2012 |
| TW | 201705392 A | 2/2017 |
| TW | 201715665 A | 5/2017 |

OTHER PUBLICATIONS

Office Action issued in corresponding Korean Application No. 10-2018-0023023, dated Mar. 20, 2019.

* cited by examiner

FAN-OUT SEMICONDUCTOR PACKAGE

CROSS-REFERENCE TO RELATED APPLICATION(S)

This application claims the benefit of priority to Korean Patent Application No. 10-2018-0023023 filed on Feb. 26, 2018, in the Korean Intellectual Property Office, the disclosure of which is incorporated herein by reference in its entirety.

TECHNICAL FIELD

The present disclosure relates to a semiconductor package.

BACKGROUND

In accordance with a current trend, small, thin semiconductor packages have gradually been developed in terms of a shape and a system in package (SiP) package that functionally requires complexation and multifunctionality have been developed. According to trends for development, recently, a fan-out wafer level package (FOWLP) has attracted attention and various technologies have been applied to FOWLP to satisfy the requirements of semiconductor packaging.

One type of semiconductor package technology suggested to satisfy the technical demand is a fan-out semiconductor package. Such a fan-out package has a compact size and may allow a plurality of pins to be implemented by redistributing electrical connection structures outwardly of a region in which a semiconductor chip is disposed.

SUMMARY

An aspect of the present disclosure may provide a fan-out semiconductor package that is capable of being thinned and has high capability to have enhanced reliability even if a plurality of semiconductor chips are used.

According to an exemplary embodiment in the present disclosure, a portion of semiconductor chips are disposed in core members in a package formed by stacking a plurality of semiconductor chips.

For example, a fan-out semiconductor package according to an embodiment of the present disclosure may include a first core member including a first through-hole, a first semiconductor chip disposed in the first through-hole of the first core member and including a first active surface with a first connection pad disposed thereon and a first non-active surface opposing the first active surface, a first encapsulant configured to encapsulate at least a portion of the first semiconductor chip, a first connection member disposed on a first active surface of the first semiconductor chip and including a first via and a first redistribution layer electrically connected to the first connection pad through the first via, a second core member adhered to a lower surface of the first connection member and including a second through-hole, a second semiconductor chip disposed in the second through-hole of the second core member and including a second active surface with a second connection pad disposed thereon and a second non-active surface opposing the second active surface, a second encapsulant configured to encapsulate the second semiconductor chip, the second core member, and the first connection member, a second connection member disposed on the second active surface of the second semiconductor chip and including a second via and a second redistribution layer, electrically connected to the second connection pad through the second via, and a connection via penetrating through the second core member and configured to electrically connect the first redistribution layer and the second redistribution layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
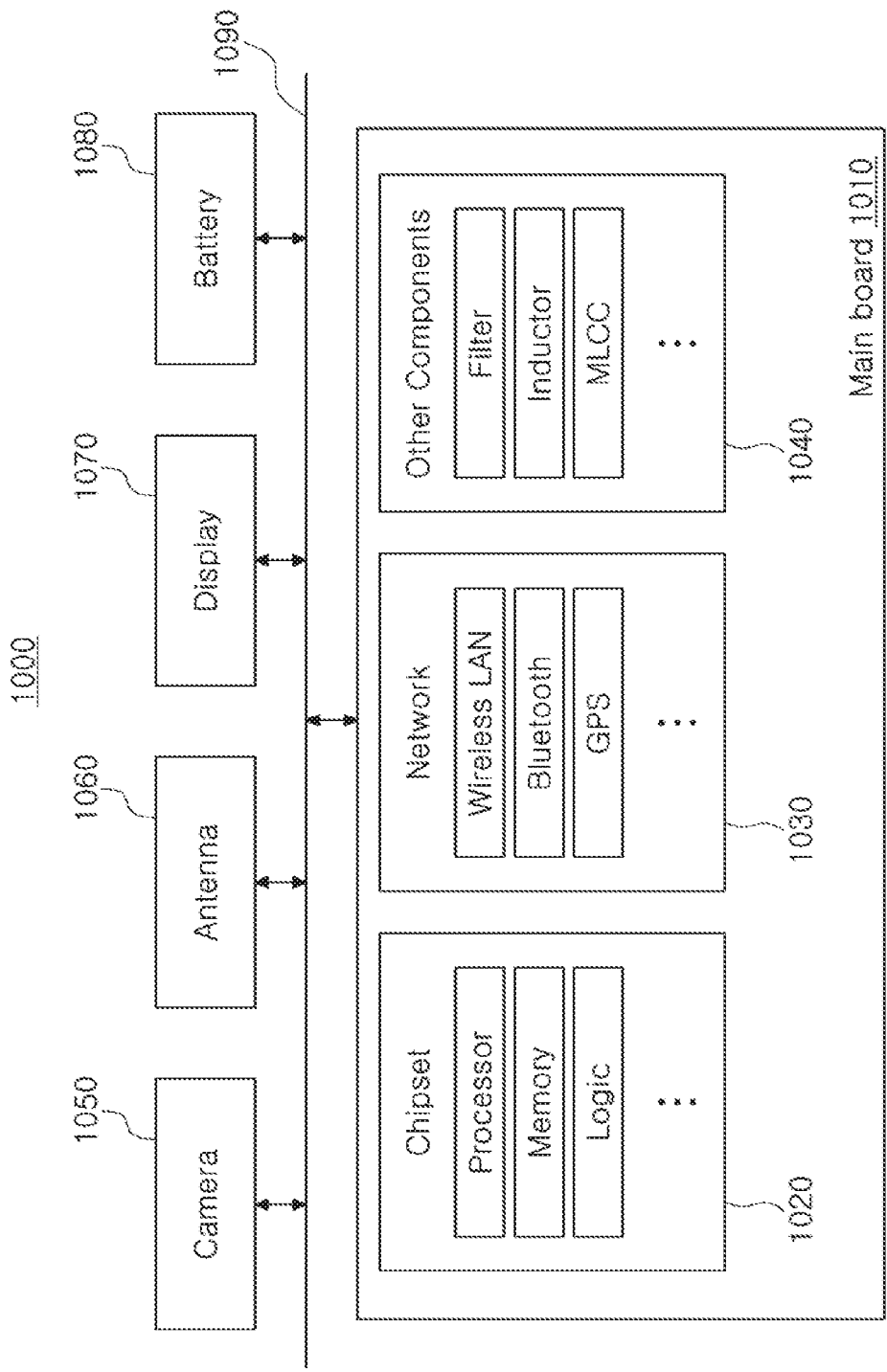
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.<0}

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
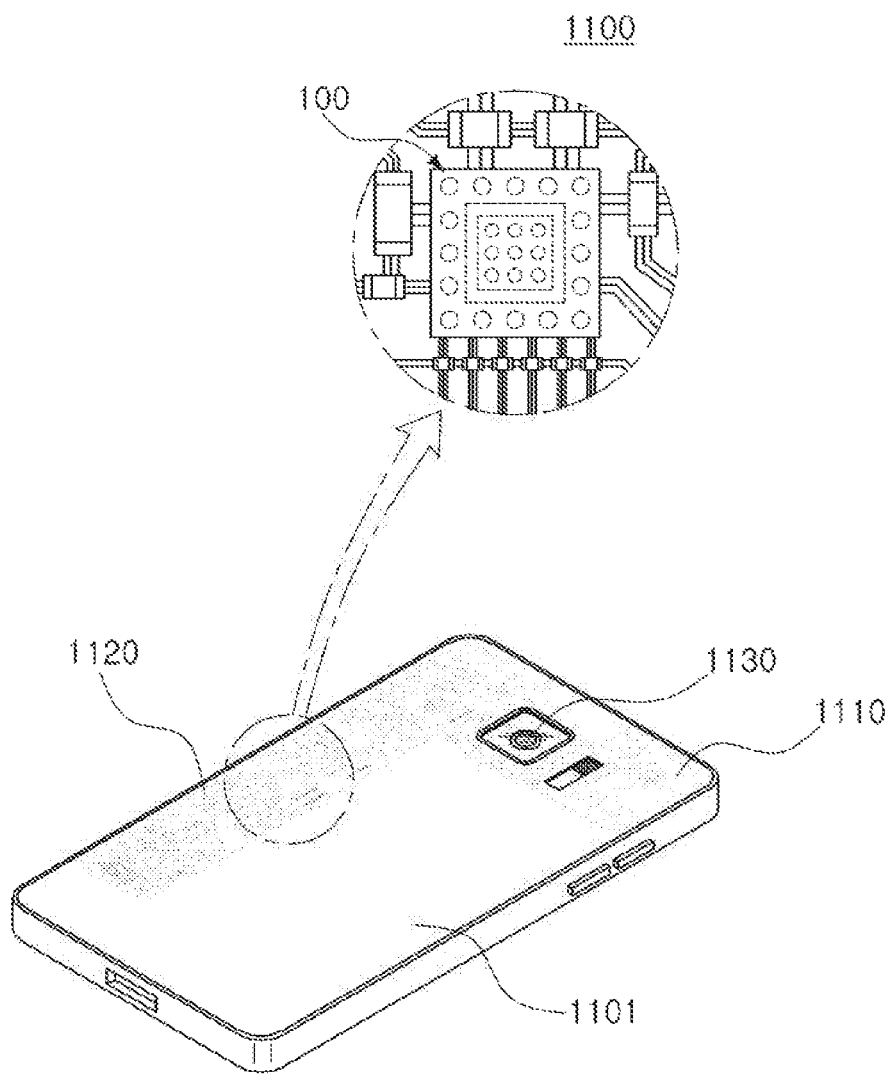
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 100, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
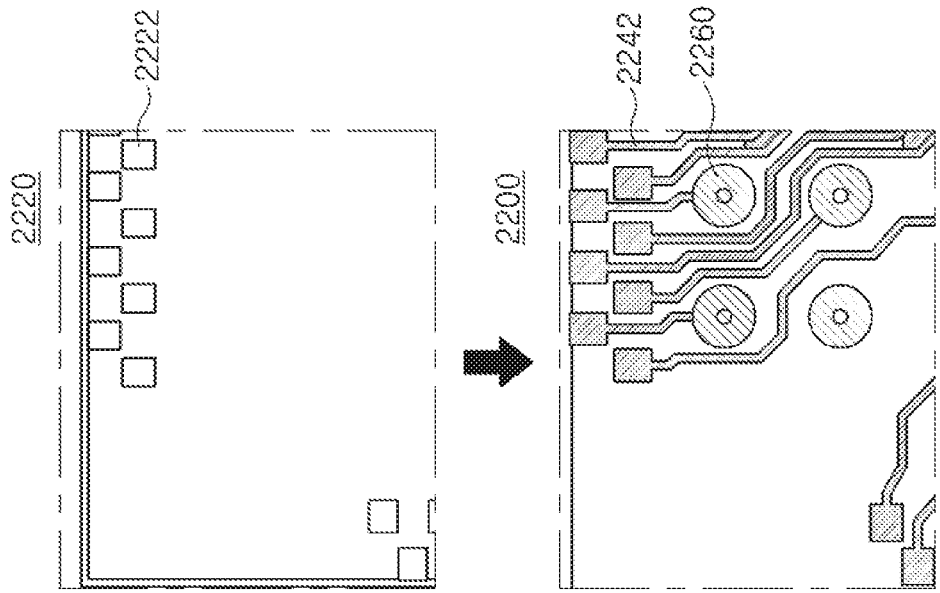
FIGS. 3A and 3B are schematic cross-sectional views illustrating states of a fan-in semiconductor package before and after being packaged.
Figure 3A:
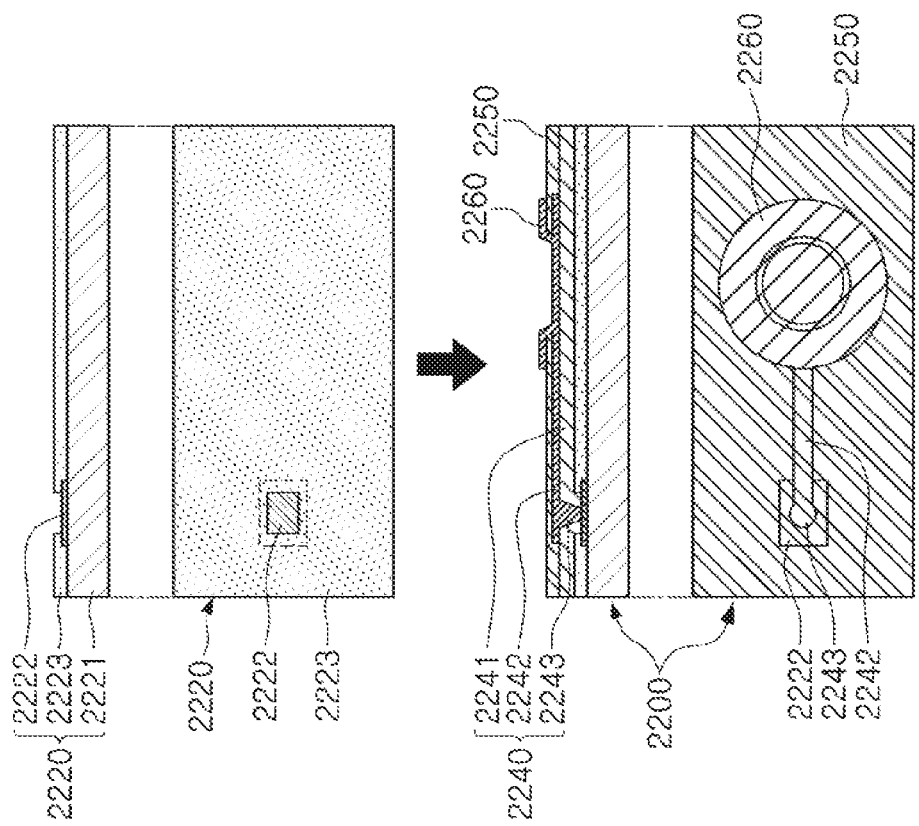

FIGS. 3A and 3B are schematic cross-sectional views illustrating states of a fan-in semiconductor package before and after being packaged.

Figure 4:
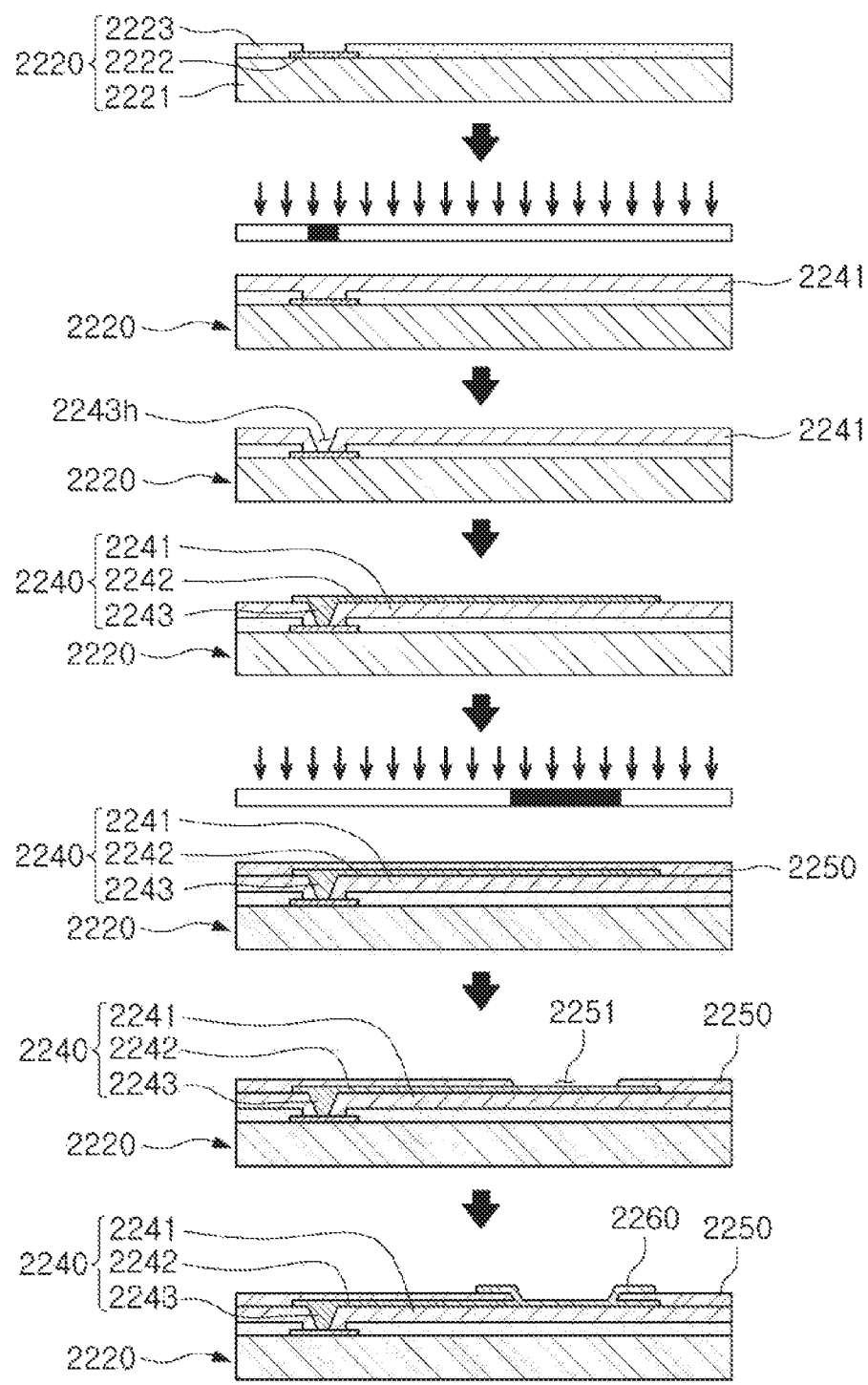
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least a portion of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
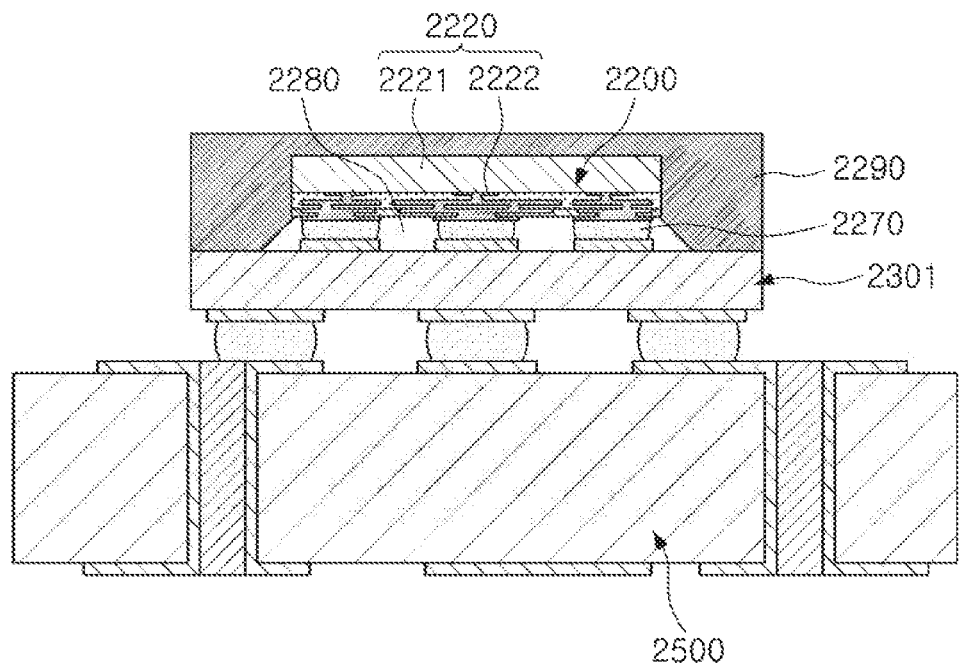
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
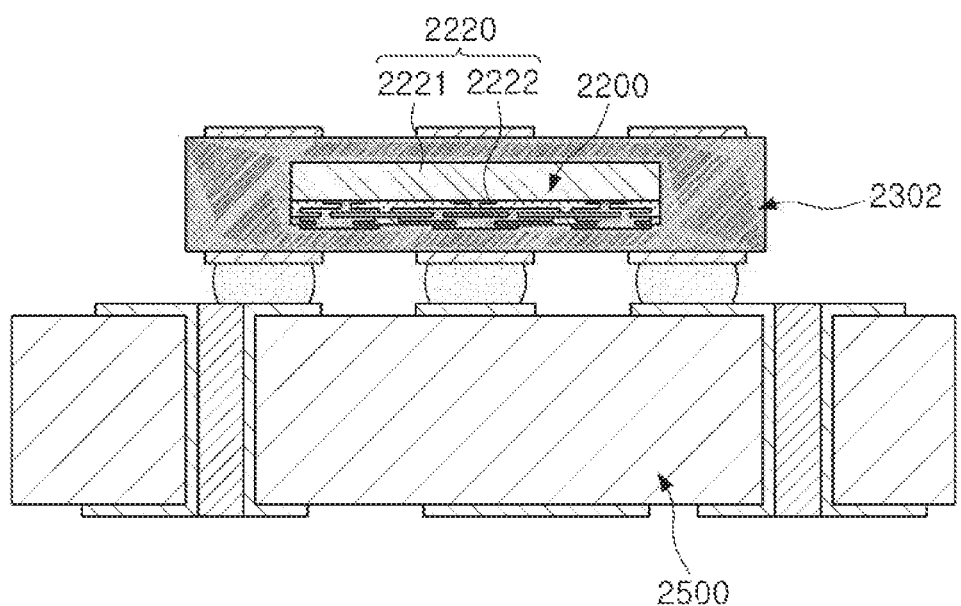
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
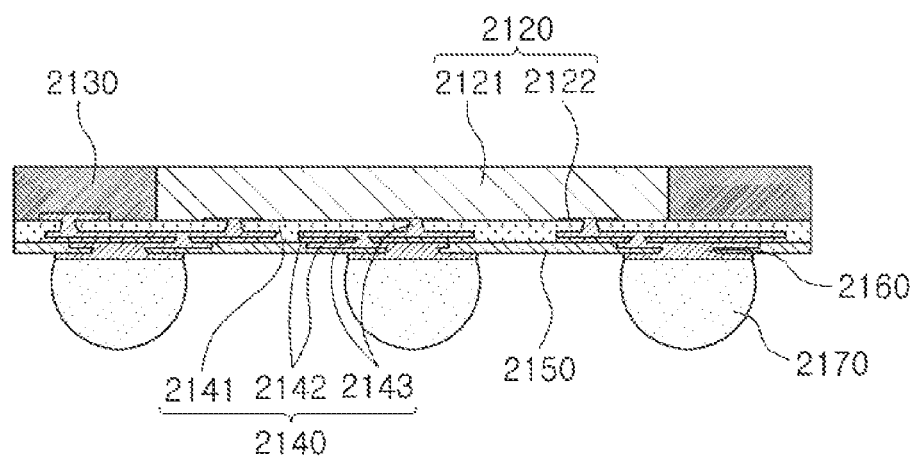
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
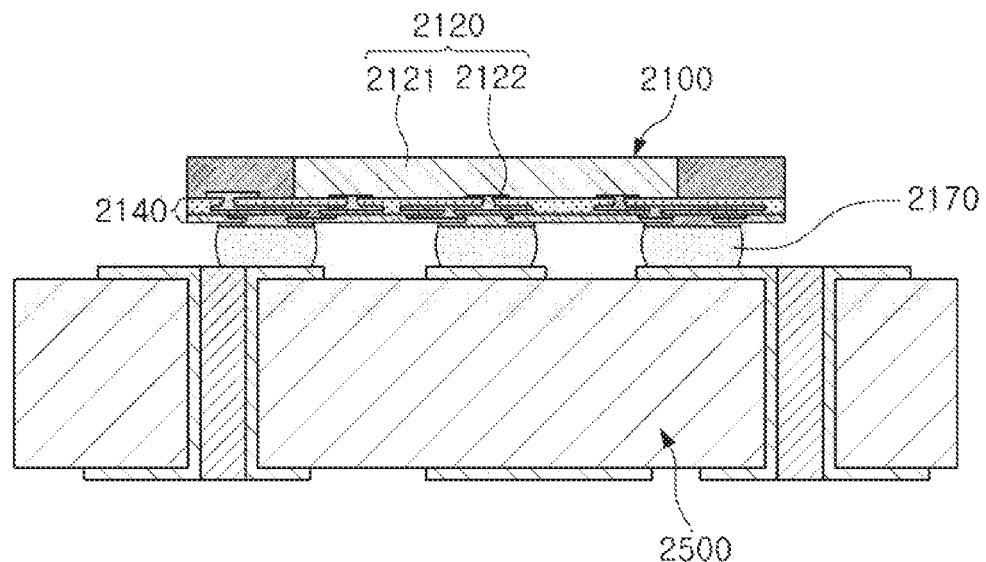
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
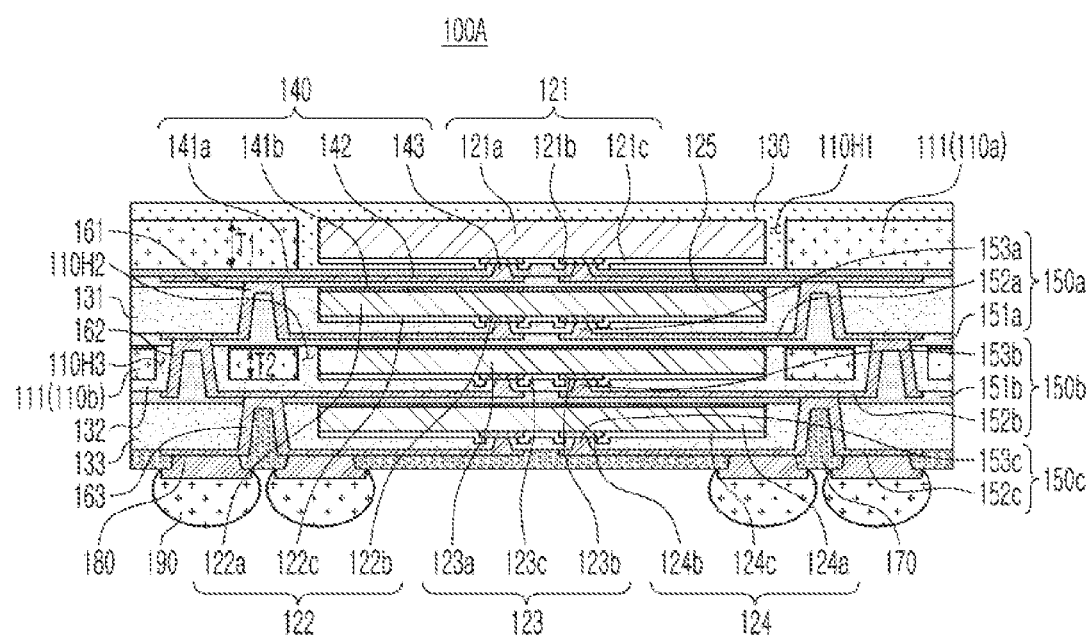
FIG. 9 is a schematic cross-sectional view of a fan-out semiconductor package according to an embodiment.

FIG. 9 is a schematic cross-sectional view of a fan-out semiconductor package according to an embodiment.

Referring to the drawing, the fan-out semiconductor package 100A according to an embodiment may include a first core member 110a having a first through-hole 110H1, a first semiconductor chip 121 including an active surface with the first connection pads 121b disposed thereon and a non-active surface opposing the active surface, the first encapsulant 130 for encapsulation of at least a portion of the first semiconductor chip 121, a first connection member 140 including a first via 143 disposed on the active surface of the first semiconductor chip 121 and a first redistribution layer 142 that is electrically connected to a first connection pads 121b through the first via 143, a second semiconductor chip 122 adhered to an opposite side to a side of the first connection member 140, on which the first semiconductor chip 121 is arranged, and including an active surface with a second connection pad 122b disposed thereon and a non-active surface opposing to the active surface, a second encapsulant 131 arranged on an opposite side of the first connection member 140, on which the first semiconductor chip 121 are arranged, and encapsulating at least a portion of the active surface of the semiconductor chips 122 and at least a portion of the first connection member 140, a second connection member 150a arranged on the active surface of the semiconductor chips 122 and including a second via 153a and a second redistribution layer 152a electrically connected to the second connection pad 122b through the second via 153a, a first connection via 161 penetrating through the second encapsulant 131 and electrically connecting the first redistribution layer 142 and the second redistribution layer 152a, a second core member 110b adhered to a lower end of the second connection member 150a and having a second through-hole 110H2, a third semiconductor chip 123 including an active surface with a third connection pad 123b disposed thereon and a non-active surface opposing the active surface, a third encapsulant 132 encapsulating at least a portion the third semiconductor chip 123, at least a portion of the second core member 110b, and the second connection member 150a, a third connection member 150b disposed on the active surface of the third semiconductor chip 123 and including a third via 153b and a third redistribution layer 152b electrically connected to the third connection pad 123b through the third via 153b, a second connection via 162 penetrating through the third encapsulant 132 and electrically connecting the second redistribution layer 152a and the third redistribution layer 152b, a fourth semiconductor chip 124 including an active surface with a fourth connection pad 124b disposed thereon and a non-active surface opposing the active surface, a fourth encapsulant 133 for encapsulation of at least a portion of the fourth semiconductor chip 124 and the third connection member 150*b*, a fourth connection member 150*c* including a fourth via 153*c* disposed on the active surface of the fourth semiconductor chip 124 and a fourth redistribution layer 152*c* electrically connected to the fourth connection pad 124*b* through the fourth via 153*c*, and a third connection via 163 penetrating through the fourth encapsulant 133 and electrically connecting the third redistribution layer 152*b* and the fourth redistribution layer 152*c*. The fan-out semiconductor package 100A may further include a passivation layer 170 disposed on the fourth encapsulant 133, an underbump metal layer 180 formed on an opening of the passivation layer 170, and electrical connection structures 190 formed on the underbump metal layer 180.

In particular, the first semiconductor chip 121 and the third semiconductor chip 123 may be arranged in first and second through-holes 110H1 and 110H2 of first and second core members 110*a* and 110*b*, respectively. The first and second core members 110*a* and 110*b* may be alternately arranged with second and fourth encapsulants 131 and 133 for encapsulation of the second semiconductor chip 122 and the fourth semiconductor chip 124 outside semiconductor chip 121, 122, 123, and 124. The first and second core members 110*a* and 110*b* may be formed of the same material and may be formed of a different material from that of the second and fourth encapsulants 131 and 133.

As such, one or more of the second to fourth semiconductor chips 122, 123, and 124 at a lower portion as well as the first semiconductor chip 121 at an upper portion may be arranged in the second core member 110*b* and, thus, rigidity of a fan-out region may be ensured compared with the case in which all of the second to fourth semiconductor chips 122, 123, and 124 at a lower portion are encapsulated only by the encapsulants 131, 132, and 133. That is, the fan-out region may be prevented from sagging compared with the instance where only the encapsulants 131, 132, and 133 are stacked. The fan-out region may refer to a region that is outside of a region on which the first to fourth semiconductor chip 121, 122, 123, and 124 are arranged. A material of the encapsulants 131, 132, and 133 tends to shrink and undulate in a region on which the semiconductor chips 122, 123, and 124 are not disposed after being cured and, as the number of stacked semiconductor chips is increased, undulation overlaps and, thus, it may be difficult to accurately form the second to fourth redistribution layers 152*a*, 152*b*, and 152*c* at a lower portion. However, the fan-out semiconductor package 100A according to an embodiment may prevent failure due to undulation. In addition, warpage control may be enabled through the first and second core members 110*a* and 110*b* to further enhance reliability.

Recently, technologies for stacking a plurality of memory chips in multi-stages have been developed to extend memory capacitance. For example, a plurality of memory chips are stacked in two stages or more, are mounted on an interposer substrate and, then, are molded by a molding member and used in the form of a package. In this case, the stacked memory chips are electrically connected to the interposer substrate via wire bonding. However, the interposer substrate is significantly thick in this structure and, thus, there is a limit in thinning the structure. When the interposer substrate is manufactured as a silicon base, there is a problem in terms of considerable price. When a separate stiffener for holding the stacked memory chips is not included, there is a problem in terms of reliability due to warpage. In particular, the memory chips are electrically connected to the interposer substrate via wire bonding and I/O needs to be redistributed and, thus, a signal path is seriously long and, thus, there is a problem in that signal loss frequently occurs.

On the other hand, the fan-out semiconductor package 100A according to an embodiment forms a signal path through a via but not wire bonding and, thus, a signal path may be minimized and, thus, signal loss may also be minimized. That is, signal electrical properties may be enhanced. In particular, connection vias 161, 162, and 163 that connect redistribution layers 142, 152*a*, 152*b*, and 152*c* that are connected to different layers may be formed and, thus, a signal with high current, etc. may be stably transmitted, thereby enhancing reliability. The first semiconductor chip 121 arranged at an upper portion as well as the second to fourth semiconductor chips 122, 123, and 124 arranged at a lower portion may be packaged in a bare state. That is, connection pads 121*b*, 122*b*, 123*b*, and 124*b* of semiconductor chip 121, 122, 123, and 124 may each be arranged in a central portion of the active surface of the semiconductor chip 121, 122, 123, and 124. This is because the first semiconductor chip 121 are connected to the first redistribution layer 142 of the first connection member 140 through the first via 143 and are each sequentially connected to the second to fourth redistribution layers 152*a*, 152*b*, and 152*c* through the first to third connection vias 161, 162, and 163 penetrating through the second to fourth encapsulants 131, 132, and 133.

As such, it may not be required to form a redistribution layer in a chip state for redesign of the connection pads 121*b*, 122*b*, 123*b*, and 124*b* of the semiconductor chip 121, 122, 123, and 124 and the connection pads 121*b*, 122*b*, 123*b*, and 124*b* positioned at the center of the semiconductor chip 121, 122, 123, and 124 may be used in the package 100A without a separate change operation to most effectively design the semiconductor chip 121, 122, 123, and 124.

The fan-out semiconductor package 100A according to an embodiment may not use an interposer substrate and, instead, connection members 140, 150*a*, 150*b*, and 150*c* including the redistribution layers 142, 152*a*, 152*b*, and 152*c* may be formed. Accordingly, the redistribution layers 142, 152*a*, 152*b*, and 152*c* may be distributed at various positions and, thus, a thickness of the connection members 140, 150*a*, 150*b*, and 150*c* may be minimized and an encapsulation thickness of a backside or a thickness of stacked chips may also be minimized. The non-active surface of the second to fourth semiconductor chips 122, 123, and 124 may be adhered to the connection members 140, 150*a*, 150*b*, and 150*c* using an adhesive member 125 such as a die attach film (DAF) and the adhered second to fourth semiconductor chips 122, 123, and 124 may be encapsulated by the second to fourth encapsulants 131, 132, and 133 and, thus, the second to fourth semiconductor chips 122, 123, and 124 may be effectively fixed, thereby enhancing reliability.

The respective components included in the fan-out semiconductor package 100A according to the exemplary embodiment will hereinafter be described in more detail.

The first core member 110*a* may improve rigidity of the fan-out semiconductor package 100A depending on certain materials, and serve to secure uniformity of a thickness of the first encapsulant 130. The fan-out semiconductor package 100A according to an embodiment may be utilized as a portion of a package-on-package (POP) type package by the first core member 110*a*. The first core member 110*a* may have a first through-hole 110H1. The first semiconductor chip 121 may be spaced apart from the first core member 110*a* by a predetermined distance in the first through-hole 110H1. In some embodiments, a plurality of first semiconductor chips 121 spaced apart from each other may be provided. A peripheral portion of a lateral surface of the first semiconductor chip 121 may be surrounded by the first core member 110*a*. However, such a form is only an example and may be variously modified to have other forms, and the first core member 110*a* may perform another function depending on such a form. Alternatively, the first core member 110*a* may be omitted but, the first core member 110*a* is used to advantageously improve board level reliability intended by the present disclosure.

The first core member 110*a* may include a core insulating layer 111. An insulating material may be used as a material of the core insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The first core member 110*a* may function as a support member.

The first semiconductor chip 121 may each be an integrated circuit (IC) in which several hundreds to several millions of devices are integrated in one chip. The first semiconductor chip 121 may be a processor chip such as a central processor (e.g., CPU), a graphics processor (e.g., GPU), a field programmable gate array (FPGA), a digital signal processor, a cryptographic processor, a microprocessor, a micro controller, or the like, in detail, an application processor (AP). However, the first semiconductor chip 121 are not limited thereto, but may be a logic chip such as an analog-digital converter or an application-specific IC (ASIC) or a memory chip such as a volatile memory (e.g., DRAM) and a non-volatile memory (e.g. ROM and flash memory) but are not limited thereto. These may be combined with each other.

The first semiconductor chip 121 may have an active surface having the first connection pads 121*b* disposed thereon and a non-active surface opposing the active surface. The first semiconductor chip 121 may be formed on the basis of an active wafer. In this case, a base material of a body 121*a* of first semiconductor chip 121 may be silicon (Si), germanium (Ge), gallium arsenide (GaAs), or the like. Various circuits may be formed on the body 121*a*. The first connection pads 121*b* may electrically connect the first semiconductor chip 121 to other components. A material of each of the first connection pads 121*b* may be a conductive material such as aluminum (Al) or the like that is not particularly limited. A passivation layer 121*c* exposing the first connection pads 121*b* may be formed on the body 121*a* and may be an oxide layer, a nitride layer, or the like, or a double layer of an oxide layer and a nitride layer. A lower surface of the first connection pads 121*b* may have a step with respect to a lower surface of the first encapsulant 130 through the passivation layer 121*c* and bleeding of the first encapsulant 130 into the lower surface of the first connection pads 121*b* may be reduced. An insulating layer (not illustrated), and the like, may also be further disposed in other required positions.

The first encapsulant 130 may protect the first core member 110*a*, the first semiconductor chip 121, and the like. An encapsulation form of the first encapsulant 130 is not particularly limited, but may be a form in which the first encapsulant 130 surrounds at least a portion of the first semiconductor chip 121. For example, the first encapsulant 130 may cover at least a portion the first core member 110*a* and the non-active surface of the first semiconductor chip 121 and may fill at least a portion of a space between a wall of the first through-hole 110H1 and a lateral surface of the first semiconductor chip 121. Meanwhile, the first encapsulant 130 may fill the through-hole 110H1 to thus serve as an adhesive for fixing the first semiconductor chip 121 and reduce buckling of the first semiconductor chip 121 depending on certain materials. A material of the first encapsulant 130 is not particularly limited. For example, an insulating material may be used as the material of the first encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photo imagable dielectric (PID) resin may also be used.

The first connection member 140 may redistribute the first connection pads 121*b* of the first semiconductor chip 121. Several tens to several hundreds of first connection pads 121*b* having various functions may be redistributed by the first connection member 140, and may be physically and/or electrically connected through the first connection via 161 depending on functions. The first connection member 140 may include a first upper insulating layer 141*a*, the first redistribution layer 142 disposed on the first upper insulating layer 141*a*, the first via 143 penetrating through the first upper insulating layer 141*a* and connecting the first connection pads 121*b* to the first redistribution layer 142, and a second lower insulating layer 141*b* disposed on the first upper insulating layer 141*a* and covering at least a portion of the first redistribution layer 142. The first insulating layers 141*a* and 141*b*, the first redistribution layer 142, the first via 143, and so on, which are included in the first connection member 140, may have larger numbers of layers than those illustrated in the drawings.

A material of each of the first insulating layers 141*a* and 141*b* may be an insulating material. In this case, in addition to the aforementioned insulating material, a photosensitive insulating material such as a PID resin may also be used as the insulating material. That is, each of the first insulating layers 141*a* and 141*b* may be a photosensitive insulating layer. When the first insulating layers 141*a* and 141*b* have photosensitive properties, the first insulating layers 141*a* and 141*b* may be formed to have a smaller thickness, and a fine pitch of the first vias 143 may be achieved more easily. Each of the first insulating layers 141*a* and 141*b* may be a photosensitive insulating layer including an insulating resin and an inorganic filler. When the first insulating layers 141*a* and 141*b* are multiple layers, materials of the first insulating layers 141*a* and 141*b* may be the same as each other, and may also be different from each other, if necessary. When the first insulating layers 141*a* and 141*b* are the multiple layers, the first insulating layers 141*a* and 141*b* may be integrated with each other depending on a process, such that a boundary therebetween may also not be apparent. A larger number of insulating layers may be formed than in the case illustrated in the drawing.

The first redistribution layer 142 may substantially serve to redistribute the first connection pads 121*b*. A material of the first redistribution layer 142 may be a conductive material such as copper (Cu), aluminum (Al), silver (Ag), tin (Sn), gold (Au), nickel (Ni), lead (Pb), titanium (Ti), or alloys thereof. The first redistribution layer 142 may perform various functions depending on designs of corresponding layers. For example, the first redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 142 may include various pad patterns such as a via pad or a connection terminal pad. All of the first connection pads 121b connected to the first via 143 may be redistributed externally of the first semiconductor chip 121, that is, the fan-out region through the first redistribution layer 142.

The first via 143 may electrically connect the first redistribution layer 142, the first connection pads 121b, and so on, which are formed at different layers, and, thus, an electrical path in the fan-out semiconductor package 100A may be formed. A material of the first via 143 may be a conductive material such as copper (Cu), aluminum (Al), silver (Ag), tin (Sn), gold (Au), nickel (Ni), lead (Pb), titanium (Ti), or alloys thereof. The first via 143 may be completely filled with a conductive material or the conductive material may also be formed along a wall of each of the via holes. The first via 143 may have any shape such as a cylindrical shape as well as a tapered shape.

The second to fourth semiconductor chips 122, 123, and 124 may each be an integrated circuit (IC) in which several hundreds to several millions of devices are integrated in one chip. The IC may be a memory chip, for example, a volatile memory (e.g., DRAM), a non-volatile memory (e.g., ROM and flash memory), or the like but is not limited thereto. Each of the second to fourth semiconductor chips 122, 123, and 124 may have an active surface having the connection pads 122b, 123b, and 124b disposed thereon and a non-active surface opposing the active surface. The second to fourth semiconductor chips 122, 123, and 124 may each be formed on the basis of an active wafer. In this case, a base material of bodies 122a, 123a, and 124a may be silicon (Si), germanium (Ge), gallium arsenide (GaAs), or the like. Various circuits may be formed on the bodies 122a, 123a, and 124a. The connection pads 122b, 123b, and 124b may electrically connect the second to fourth semiconductor chips 122, 123, and 124 to other components. A material of each of the connection pads 122b, 123b, and 124b may be a conductive material such as aluminum (Al) or the like and is not particularly limited thereto. Alternatively, passivation layers 122c, 123c, and 124c exposing the connection pads 122b, 123b, and 124b may be formed on the bodies 122a, 123a, and 124a and may be an oxide layer, a nitride layer, or the like, or a double layer of an oxide layer and a nitride layer. An insulating layer (not illustrated), and the like, may also be further disposed in other required positions.

The adhesive member 125 may easily attach a non-active surface of the second to fourth semiconductor chips 122, 123, and 124 to a lower surface of the first to third connection members 140, 150a, and 150b at an upper portion, respectively. In addition, the second core member 110b may be easily adhered to the lower surface of the second connection member 150a. The adhesive member 125 may be a tape, for example, a die attach film (DAF). A material of the adhesive member 125 is not particularly limited. The adhesive member 125 may include, for example, an epoxy element but is not limited thereto. The second to fourth semiconductor chips 122, 123, and 124 and the second core member 110b may be more stably mounted through the adhesive member 125, thereby enhancing reliability.

The second to fourth encapsulants 131, 132, and 133 may protect the second to fourth semiconductor chips 122, 123, and 124. An encapsulation form is not particularly limited and may be any form as long as at least a portion of the second to fourth semiconductor chips 122, 123, and 124 and the connection members 140, 150a, and 150b are surrounded. For example, each of the second to fourth encapsulants 131, 132, and 133 may cover at least a portion of the active surface of the second to fourth semiconductor chips 122, 123, and 124 and cover at least a portion of a lateral surface thereof. The third encapsulant 132 may cover at least a portion of the second core member 110b and the non-active surface of the semiconductor chips 122 and may fill at least a portion of a space between a wall of the second through-hole 110H2 and a lateral surface of the semiconductor chips 122. The second to fourth encapsulants 131, 132, and 133 may include an insulating material. The insulating material may be a photo imagable epoxy (PIE), PID, or the like. However, the insulating material is not limited thereto and may be a material including an inorganic filler and an insulating resin, for example, a thermosetting resin such as an epoxy resin, a thermoplastic resin such as a polyimide resin, or a resin in which a stiffener including an inorganic filler is mixed therewith and, in detail, may be ABF or the like. A molding material such as EMC or the like may also be used. Alternatively, a material of the second to fourth encapsulants 131, 132, and 133 may be a material in which the thermosetting resin or the thermoplastic resin is mixed with an inorganic filler and/or is impregnated together with an inorganic filler in a core material such as a glass fiber (or a glass cloth or a glass fabric).

The second core member 110b may improve rigidity of the fan-out semiconductor package 100A depending on certain materials, and serve to secure uniformity of a thickness of the third encapsulant 132. The second core member 110b may further include a via through-hole 110H3 in which the second connection via 162 is disposed as well as the second through-hole 110H2 in which the third semiconductor chip 123 is disposed. The third semiconductor chip 123 may be spaced apart from the second core member 110b by a predetermined distance in the second through-hole 110H2. The second connection via 162 may penetrate through the third encapsulant 132 in the via through-hole 110H3. A peripheral portion of a lateral surface of the third semiconductor chip 123 may be surrounded by the second core member 110b. A thickness T2 of the second core member 110b may be smaller than a thickness T1 of the first core member 110a but the present disclosure is not limited thereto and the thickness T2 of the second core member 110b may be increased and reduced depending on a thickness of the third semiconductor chip 123. The second core member 110b may also include the core insulating layer 111 like the first core member 110a. A material of the core insulating layer 111 may be an insulating material. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The third encapsulant 132 may be formed on a lower surface of the third semiconductor chip 123 to have a flat lower surface by the second core member 110b.

The second to fourth connection members 150a, 150b, and 150c may redistribute connection pads 122b, 123b, and 124b of the second to fourth semiconductor chips 122, 123, and 124, respectively. Several tens to several hundreds of the connection pads 122b, 123b, and 124b having various functions may be redistributed by the second to fourth connection members 150a, 150b, and 150c, and may be physically and/or electrically connected through the second to fourth vias 153a, 153b, and 153c depending on functions. The second connection member 150a may include the second redistribution layer 152a disposed on the second encapsulant 131, the second via 153a penetrating through the second encapsulant 131 and connecting the second connection pad 122b to the second redistribution layer 152a, and a second insulating layer 151a disposed on the second encapsulant 131. The second redistribution layer 152a may be electrically connected to the second connection pad 122b of the semiconductor chips 122. The third connection member 150b may include the third redistribution layer 152b disposed on the third encapsulant 132, the third via 153b penetrating through the third encapsulant 132 and connecting the third connection pad 123b to the third redistribution layer 152b, and a third insulating layer 151b disposed on the third encapsulant 132. The third redistribution layer 152b may be electrically connected to the third connection pad 123b of the third semiconductor chip 123. The fourth connection member 150c may include the fourth redistribution layer 152c disposed on the fourth encapsulant 133 and the fourth via 153c penetrating the fourth encapsulant 133 and connecting the fourth connection pad 124b to the fourth redistribution layer 152c. The fourth redistribution layer 152c may be electrically connected to the fourth connection pad 124b of the fourth semiconductor chip 124. The insulating layers 151a, 151b, and 151c, the redistribution layers 152a, 152b, and 152c, and the vias 153a, 153b, and 153c, which are included in the second to fourth connection members 150a, 150b, and 150c, may have larger numbers of layers or larger numbers thereof than those illustrated in the drawings.

A material of the second and third insulating layers 151a and 151b may be an insulating material. In this case, a photosensitive insulating material such as a PID resin other than the aforementioned insulating material may also be used as the insulating material. That is, the second and third insulating layers 151a and 151b may be a photosensitive insulating layer. When the second and third insulating layers 151a and 151b have photosensitive properties, the second and third insulating layers 151a and 151b may be formed to have a smaller thickness, and a fine pitch of the second and third vias 153a and 153b at a lower portion may be achieved more easily.

The second to fourth redistribution layers 152a, 152b, and 152c may substantially redistribute the second to fourth connection pads 122b, 123b, and 124b and may be formed of a conductive material such as copper (Cu), aluminum (Al), silver (Ag), tin (Sn), gold (Au), nickel (Ni), lead (Pb), titanium (Ti), or alloys thereof. The second to fourth redistribution layers 152a, 152b, and 152c may perform various functions depending on designs of corresponding layers. For example, second to fourth redistribution layers 152a, 152b, and 152c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second to fourth redistribution layers 152a, 152b, and 152c may include various pad patterns such as a via pad and a connection terminal pad.

The second to fourth vias 153a, 153b, and 153c may electrically connect the second to fourth redistribution layers 152a, 152b, and 152c, the second to fourth connection pads 122b, 123b, and 124b, and so on, which are formed at different layers, and, accordingly, an electrical path may be formed in the fan-out semiconductor package 100A. A material of the second to fourth vias 153a, 153b, and 153c may be a conductive material such as copper (Cu), aluminum (Al), silver (Ag), tin (Sn), gold (Au), nickel (Ni), lead (Pb), titanium (Ti), or alloys thereof. The second to fourth vias 153a, 153b, and 153c may be completely filled with a conductive material or the conductive material may also be formed along a wall of each of via holes. The second to fourth vias 153a, 153b, and 153c may have any shape such as a cylindrical shape as well as a tapered shape. However, the second to fourth vias 153a, 153b, and 153c may have a reverse tapered shape with a greater lower diameter than an upper diameter and may advantageously have this shape in terms of a process.

The first to third connection vias 161, 162, and 163 may electrically connect the first to fourth redistribution layers 142, 152a, 152b, and 152c formed at different layers and, accordingly, an electrical path may be formed. The first to third connection vias 161, 162, and 163 may be arranged below the first core member 110a in an external region of the semiconductor chip 121, 122, 123, and 124. In particular, the first connection via 161 may be arranged at at least one side of the second semiconductor chip 122, may penetrate through the second encapsulant 131, and may also penetrate through the first lower insulating layer 141b of the first connection member 140. The second connection via 162 may be arranged at at least one side of the third semiconductor chip 123, may penetrate through the third encapsulant 132 in the via through-hole 110H3 of a second core member 111b, and may also penetrate through the second insulating layer 151a of the second connection member 150a. The third connection via 163 may be arranged at at least one side of the fourth semiconductor chip 124, may penetrate through the fourth encapsulant 133, and may also penetrate through the third insulating layer 151b of the third connection member 150b. A material of the first to third connection vias 161, 162, and 163 may be a conductive material such as copper (Cu), aluminum (Al), silver (Ag), tin (Sn), gold (Au), nickel (Ni), lead (Pb), titanium (Ti), or alloys thereof. The first to third connection vias 161, 162, and 163 may be completely filled with a conductive material or the conductive material may also be formed along a wall of each of via holes. When each of the first to third connection vias 161, 162, and 163 is formed to a predetermined thickness along a wall of each of via holes penetrating through the second to fourth encapsulants 131, 132, and 133, spaces between the first to third connection vias 161, 162, and 163 of the via holes may each be filled with the second and third insulating layers 151a and 151b and the passivation layer 170. The first to third connection vias 161, 162, and 163 may have a tapered shape with a greater lower diameter than an upper diameter and may advantageously have this shape in terms of a process. That is, when the first to third connection vias 161, 162, and 163 are cut along a perpendicular surface to a first active surface, the cut surface of each of the first to third connection vias 161, 162, and 163 may have a tapered shape. A diameter of each of the first to third connection vias 161, 162, and 163 may be greater than that of each of the first to fourth vias 143, 153a, 153b, and 153c. A height of each of the first to third connection vias 161, 162, and 163 may be greater than that of each of the first to fourth vias 143, 153a, 153b, and 153c. The first to third connection vias 161, 162, and 163 may be formed in staggered vias formed by arranging vias adjacent to each other in up and down directions at different positions on a plane but are not limited thereto. In some embodiments, the first to third connection vias 161, 162, and 163 may be formed in stack vias formed by stacking vias in a perpendicular direction to a stack direction of the semiconductor chip 121, 122, 123, and 124.

The passivation layer 170 may protect the fourth connection member 150c from external physical and chemical damage, and so on. The passivation layer 170 may have an opening that exposes at least a portion of the fourth redistribution layer 152c of the fourth connection member 150c. Several tens to several thousands of openings may be formed in the passivation layer 170. A material of the passivation layer 170 is not particularly limited. For example, an insulating material may be used. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a solder resist may be used.

The underbump metal layer 180 may improve connection reliability of the electrical connection structures 190 to improve board level reliability of the fan-out semiconductor package 100A. The underbump metal layer 180 may be connected to the fourth redistribution layer 152c of the fourth connection member 150c exposed through the opening of the passivation layer 170. The underbump metal layer 180 may be formed in the opening of the passivation layer 170 by any known metallization method using any known conductive metal such as a metal, but is not limited thereto.

The electrical connection structures 190 may physically and/or electrically externally connect the fan-out semiconductor package 100A. For example, the fan-out semiconductor package 100A may be mounted on the mainboard of the electronic device through the electrical connection structures 190. The electrical connection structures 190 may be formed of a conductive material, for example a solder. However, this is only an example, and a material of the electrical connection structures 190 is not particularly limited thereto. The electrical connection structures 190 may be a land, a ball, a pin, or the like. The electrical connection structures 190 may be formed as a multilayer or single layer structure. When the electrical connection structures 190 are formed as a multilayer structure, the electrical connection structures 190 may include a copper (Cu) pillar and a solder. When the electrical connection structures 190 are formed as a single layer structure, the electrical connection structures 190 may include a tin-silver solder or copper (Cu). However, this is only an example, and the electrical connection structures 190 are not limited thereto.

The number, an interval, a disposition form, and the like, of the electrical connection structures 190 are not particularly limited, but may be sufficiently modified depending on design particulars by those skilled in the art. For example, the electrical connection structures 190 may be provided in an amount of several tens to several thousands according to the number of the connection pads 121b, 122b, 123b, and 124b, or may be provided in an amount of several tens to several thousands or more or several tens to several thousands or less. When the electrical connection structures 190 are solder balls, the electrical connection structures 190 may cover side surfaces of the underbump metal layer 180 extending onto one surface of the passivation layer 170, and connection reliability may be more excellent.

At least one of the electrical connection structures 190 may be disposed in a fan-out region. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated, alternatively, a metal thin film may be formed on a wall of the first through-hole 110H1 for heat dissipation and/or electromagnetic wave shield. Alternatively, a plurality of semiconductor chips performing the same function or different functions may be arranged in the first through-hole 110H1. Alternatively, a separate passive component, for example, an inductor or a capacitor may be arranged in the first through-hole 110H1. Alternatively, a passive component, for example, a surface mounting technology (SMT) component including an inductor or a capacitor may be arranged on a surface of the passivation layer 170.

FIGS. 10A to 10F are schematic cross-sectional views illustrating manufacturing of the fan-out semiconductor package of FIG. 9 according to an embodiment.

Figure 10A:
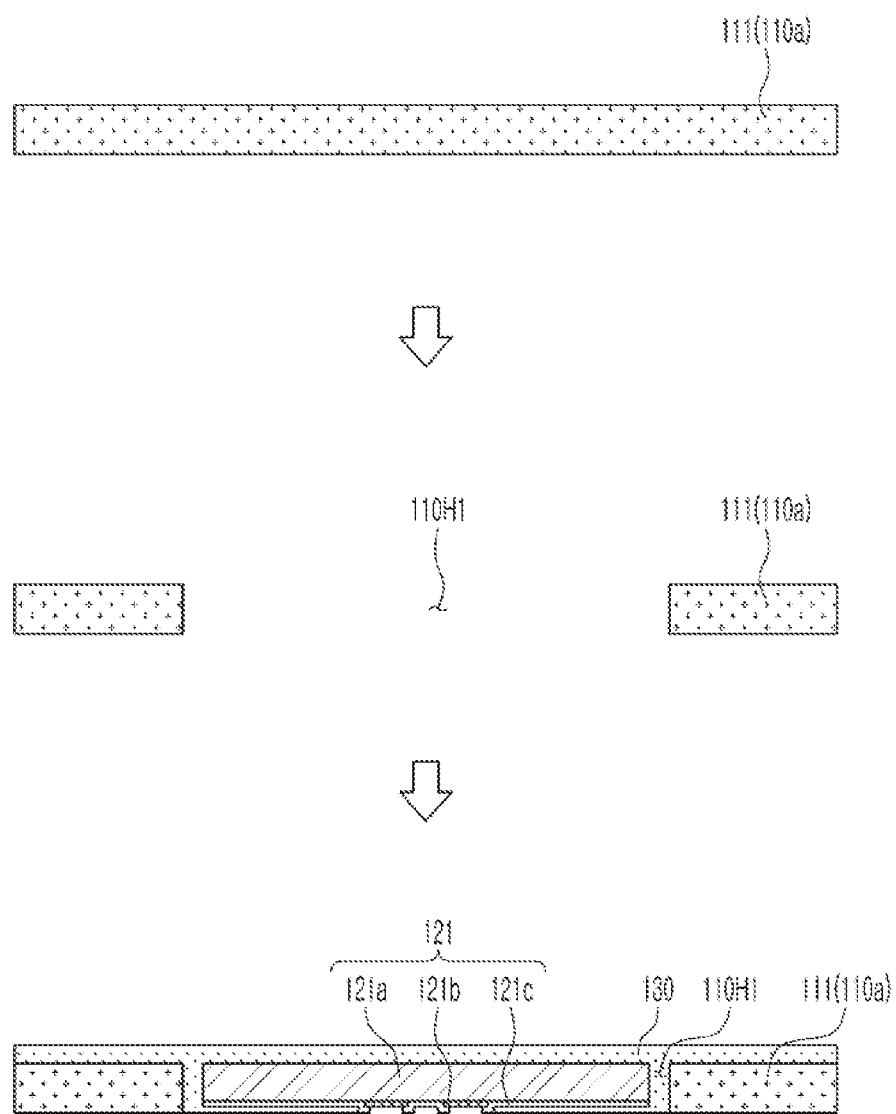
FIGS. 10A to 10F are schematic cross-sectional views illustrating manufacturing of the fan-out semiconductor package of FIG. 9 according to an embodiment.

Referring to FIG. 10A, first, the first core member 110a may be prepared. The first core member 110a may include the core insulating layer 111. The core insulating layer 111 may be an unclad CCL or the like but is not limited thereto. Then, the first through-hole 110H1 formed in the first core member 110a. The first through-hole 110H1 may be formed using a mechanical drill and/or a laser drill but is not limited thereto. After the first through-hole 110H1 is formed, desmear processing or the like may be further performed. Then, the first semiconductor chip 121 may be arranged in the form of a face-down form in the first through-hole 110H1 of the first core member 110a and may be encapsulated by the first encapsulant 130. The first semiconductor chip 121 may be arranged using an adhesive film (not shown) or the like. For example, an adhesive film (not shown) may be adhered to the first core member 110a, the first semiconductor chip 121 may be adhered to a portion of adhesive film (not shown), exposed through the first through-hole 110H1, the first encapsulant 130 may be formed using a lamination method or coating method and, then, the adhesive film (not shown) may be removed.

Figure 10B:
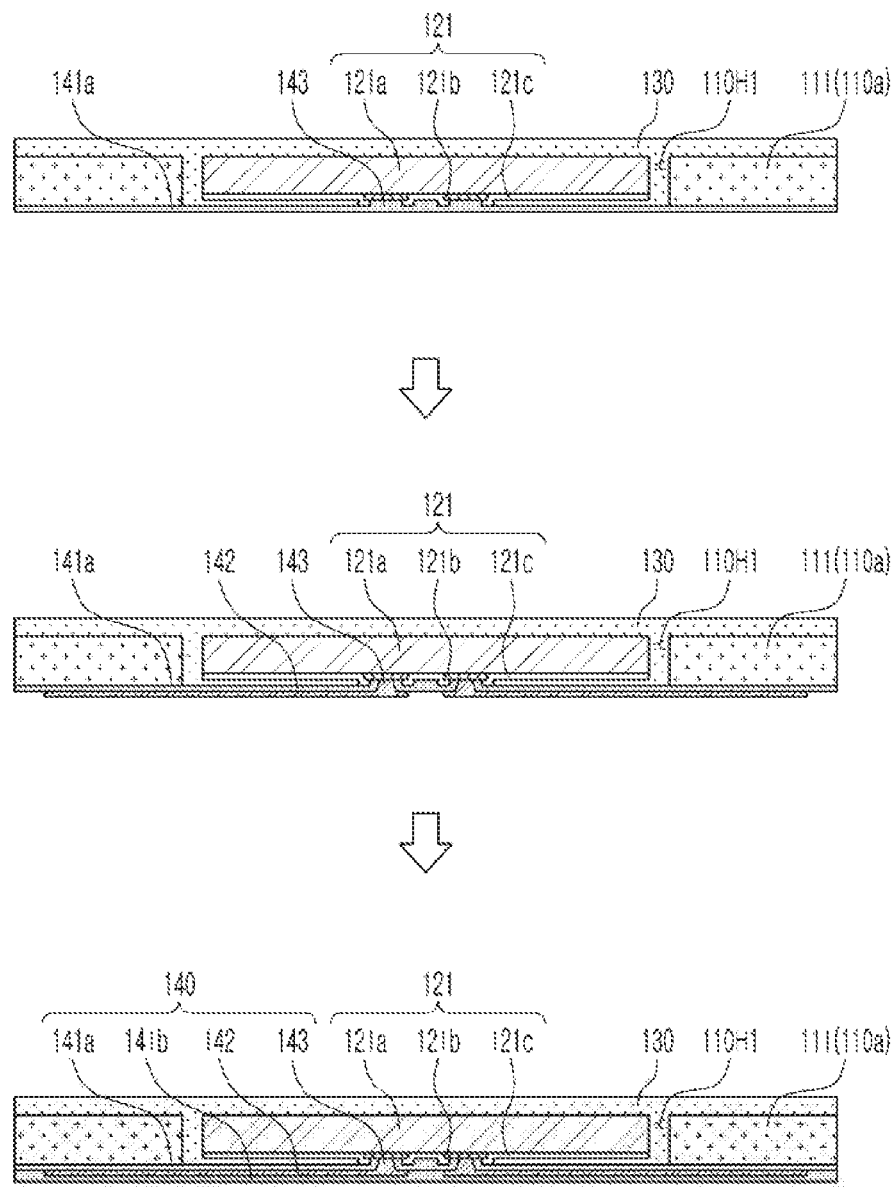

Referring to FIG. 10B, the first upper insulating layer 141a may be formed on the first core member 110a and the active surface of the first semiconductor chip 121. The first upper insulating layer 141a may also be formed by laminating or coating PID or the like. Then, the first via 143 penetrating through the first upper insulating layer 141a and the first redistribution layer 142 may be formed. The first redistribution layer 142 and the first via 143 may be formed by forming a pattern using a dry film or the like and, then, filling the pattern using a plating method. The plating method may be subtractive, additive, a semi-additive process (SAP), a modified semi-additive process (MSAP), or the like but is not limited thereto. Then, the first lower insulating layer 141b may be formed on the first upper insulating layer 141a. The first lower insulating layer 141b may also be formed by laminating or coating PID or the like. As a result, the first connection member 140 may be formed.

Figure 10C:
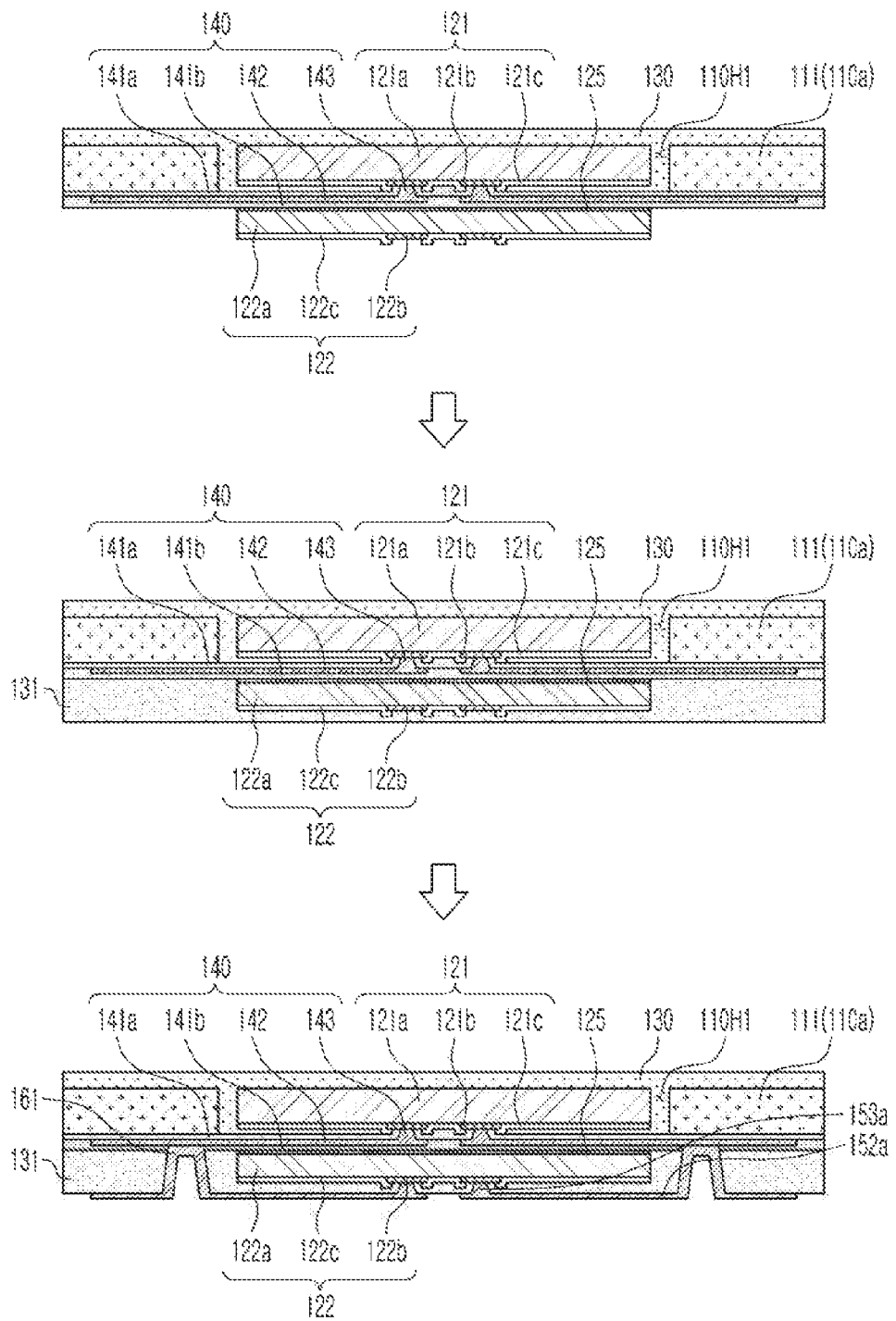

Referring to FIG. 10C, the semiconductor chips 122 may be adhered to the first lower insulating layer 141b using the adhesive member 125 or the like. Then, the second encapsulant 131 for encapsulating at least a portion of the semiconductor chips 122 may be formed using a lamination method, coating method, or the like. Then, the second via 153a penetrating through the second encapsulant 131 and the second redistribution layer 152a may be formed. The first connection via 161 penetrating through the second encapsulant 131 and the first lower insulating layer 141b of the first connection member 140 may be formed. To form the second via 153a and the first connection via 161, first, a via hole may be formed via photolithography using exposure and development. However, the via hole may be formed using a mechanical drill and/or a laser drill depending on a material of the second encapsulant 131. The second via 153a, the second redistribution layer 152a, and the first connection via 161 may be formed by forming a pattern using a dry film or the like and, then, filling the pattern using a plating method. The plating method may be subtractive, additive, a semi-additive process (SAP), a modified semi-additive process (MSAP), or the like but is not limited thereto.

Figure 10D:
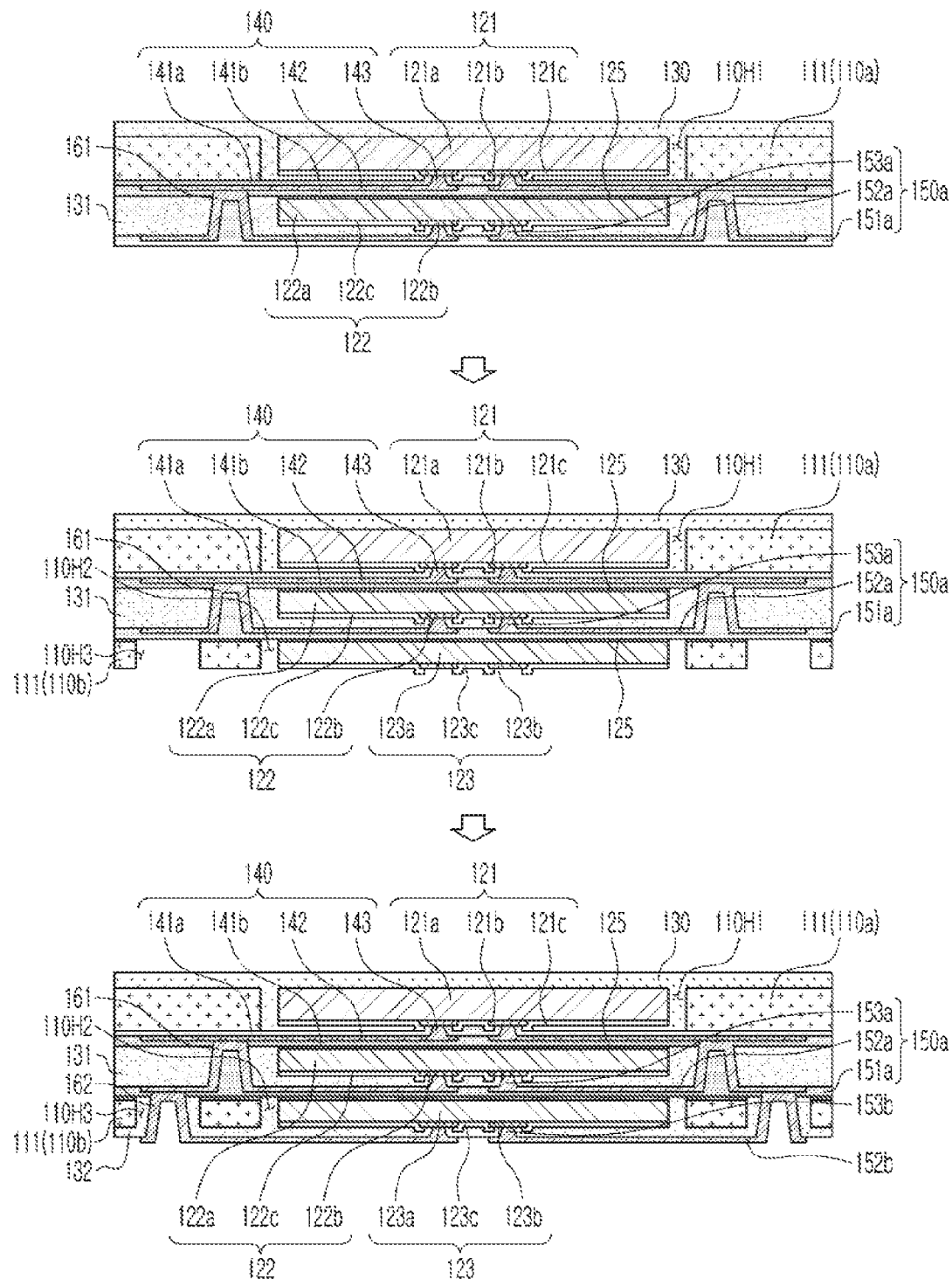

Referring to FIG. 10D, the second insulating layer 151a may be formed on the second encapsulant 131. When a space is present in the first connection via 161, the second insulating layer 151a may be formed to fill the space. The second insulating layer 151a may be formed by laminating or coating PID, PIE, or the like. Accordingly, the second connection member 150a may be formed. Then, the second core member 110b and the third semiconductor chip 123 may be adhered to a lower surface of the second insulating layer 151a using the adhesive member 125 or the like. The second core member 110b may be adhered to the lower surface in a state in which the second through-hole 110H2 and the via through-hole 110H3 are formed but the present disclosure is not limited thereto. Alternatively, after the second core member 110b may be adhered to the lower surface, the second through-hole 110H2 and the via through-hole 110H3 may be formed. Then, the third encapsulant 132 for encapsulating at least a portion of the third semiconductor chip 123 may be formed using a method such as a coating method, or the like and the third via 153b penetrating through the third encapsulant 132 and the third redistribution layer 152b may be formed. The second connection via 162 penetrating through third encapsulant 132 and the second insulating layer 151a of the second connection member 150a may be formed. To form the third via 153b and the second connection via 162, first, a via hole may be formed via photolithography using exposure and development. However, the via hole may be formed using a mechanical drill and/or a laser drill depending on a material of the third encapsulant 132. The third via 153b, the third redistribution layer 152b, and the second connection via 162 may be formed by forming a pattern using a dry film or the like and, then, filling the pattern using a plating method. The plating method may be subtractive, additive, a semi-additive process (SAP), a modified semi-additive process (MSAP), or the like but is not limited thereto.

Figure 10E:
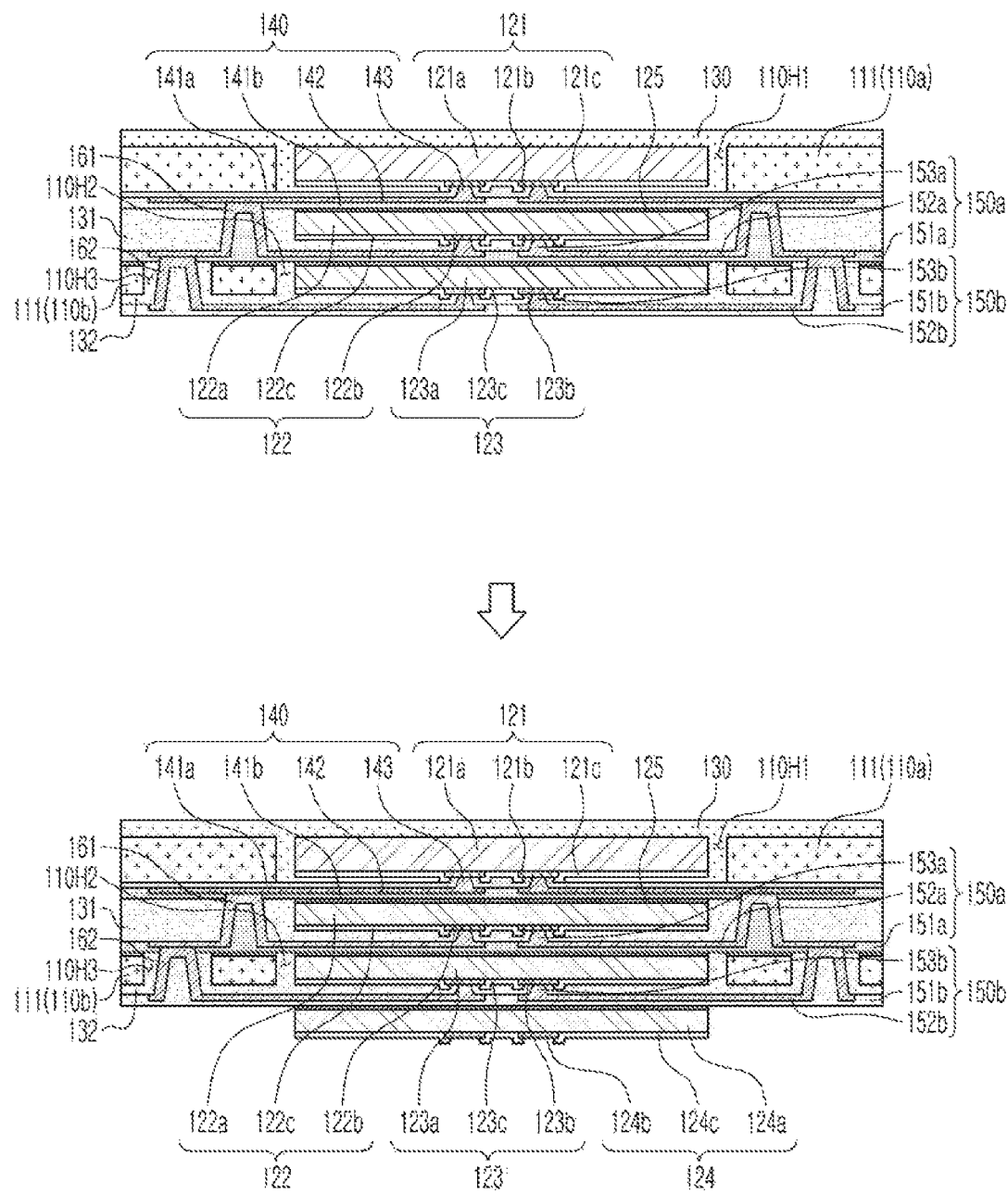

Referring to FIG. 10E, the third insulating layer 151b may be formed on the third encapsulant 132. When a space is present in the second connection via 162, the third insulating layer 151b may be formed to fill the space. The third insulating layer 151b may be formed by laminating or coating PID, PIE, or the like. As a result, the third connection member 150b may be formed. Then, the fourth semiconductor chip 124 may be adhered to the third insulating layer 151b using the adhesive member 125 or the like.

Figure 10F:
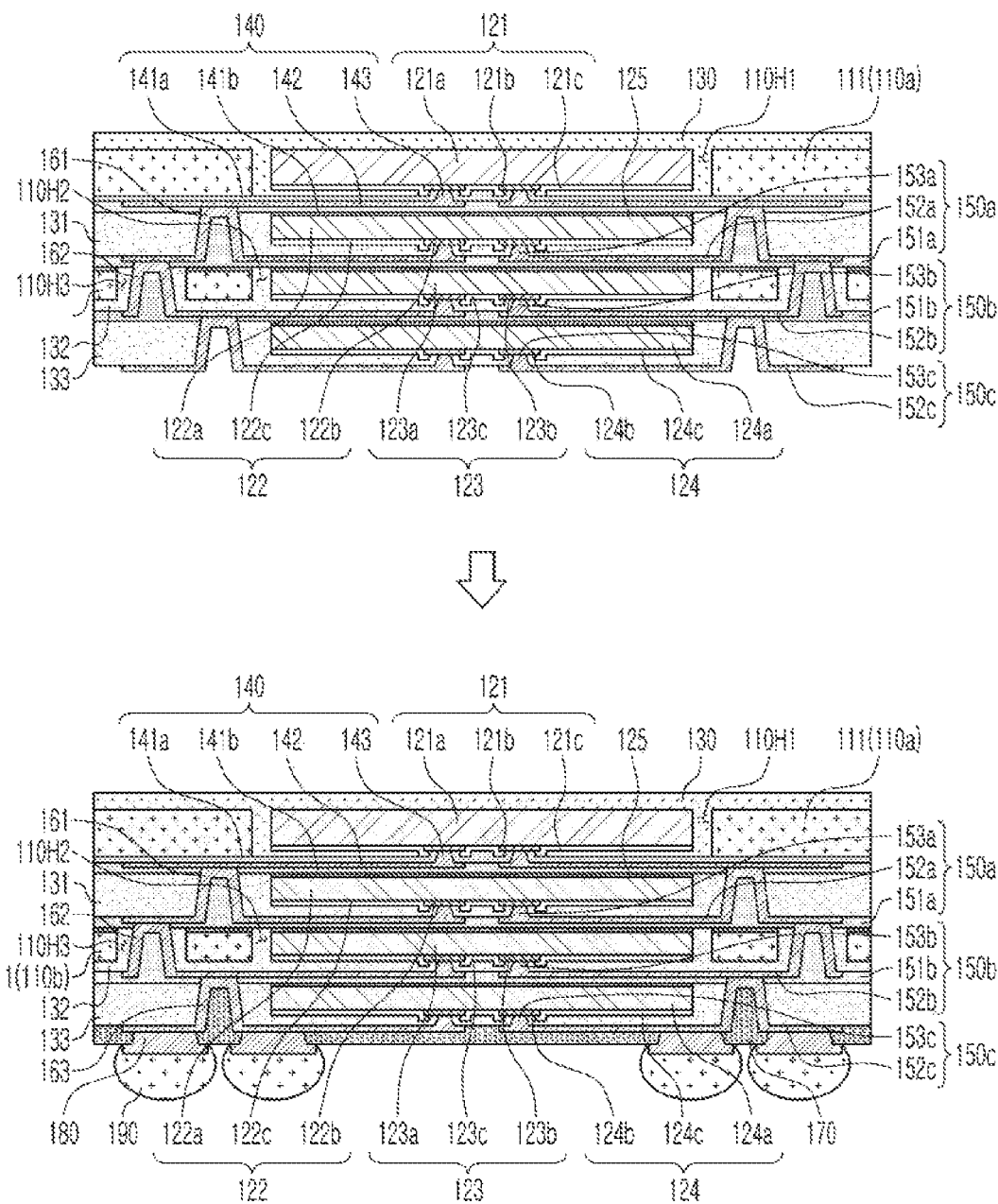

Referring to FIG. 10F, the fourth encapsulant 133 for encapsulating at least a portion of the fourth semiconductor chip 124 may be formed using a lamination or coating method, or the like. The fourth via 153c penetrating through the fourth encapsulant 133 and the fourth redistribution layer 152c may be formed. The third connection via 163 penetrating through the fourth encapsulant 133 and the third insulating layer 151b of the third connection member 150b may be formed. To form the fourth via 153c and the third connection via 163, first, a via hole may be formed via photolithography using exposure and development. However, the via hole may be formed using a mechanical drill and/or a laser drill depending on a material of the fourth encapsulant 133. The fourth via 153c, the fourth redistribution layer 152c, and the third connection via 163 may be formed by forming a pattern using a dry film or the like and, then, filling the pattern using a plating method. The plating method may be subtractive, additive, a semi-additive process (SAP), a modified semi-additive process (MSAP), or the like but is not limited thereto. Then, the passivation layer 170, the underbump metal layer 180, and the electrical connection structures 190 may be sequentially formed. The passivation layer 170 may be formed using a lamination or hardening method, the underbump metal layer 180 may be formed using a metallization method, and the electrical connection structures 190 may be formed using a reflow process or the like.

For easy mass production, such a series of processes may include preparing the first core member 110a with a large-capacity and size to manufacture a plurality of fan-out semiconductor packages and, then, performing singulation on the fan-out semiconductor packages into separate fan-out semiconductor packages through a sawing process. In this case, productivity may be advantageously excellent.

Figure 11:
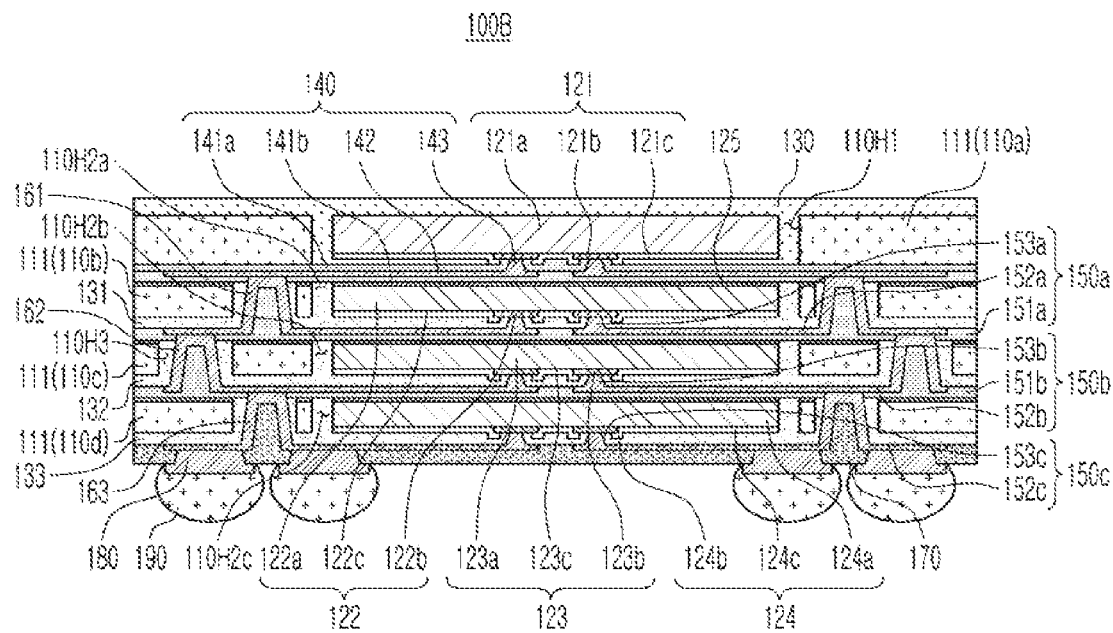
FIG. 11 is a schematic cross-sectional view illustrating a fan-out semiconductor package according to another embodiment.

FIG. 11 is a schematic cross-sectional view illustrating a fan-out semiconductor package according to another embodiment.

Referring to the drawing, a fan-out semiconductor package 100B according to another embodiment may include first to fourth core members 110a, 110b, 110c, and 110d that are perpendicularly stacked, and the first to fourth semiconductor chip 121, 122, 123, and 124 may be arranged in through-holes 110H1, 110H2a, 110H2b, and 110H2c of the first to fourth core members 110a, 110b, 110c, and 110d, respectively. The first to fourth core members 110a, 110b, 110c, and 110d may be formed of the same material and may be formed of a different material from first to fourth encapsulants 130, 131, 132, and 133. As such, in some embodiments, at least some of the semiconductor chip 121, 122, 123, and 124 may be arranged in the core members 110a, 110b, 110c, and 110d and the number of the semiconductor chip 121, 122, 123, and 124 arranged in the core members 110a, 110b, 110c, and 110d may be changed in various ways in some embodiments. A description of other components and manufacturing methods are substantially the same as the above description of the fan-out semiconductor package 100A according to the aforementioned example and, thus, is omitted herein.

Figure 12:
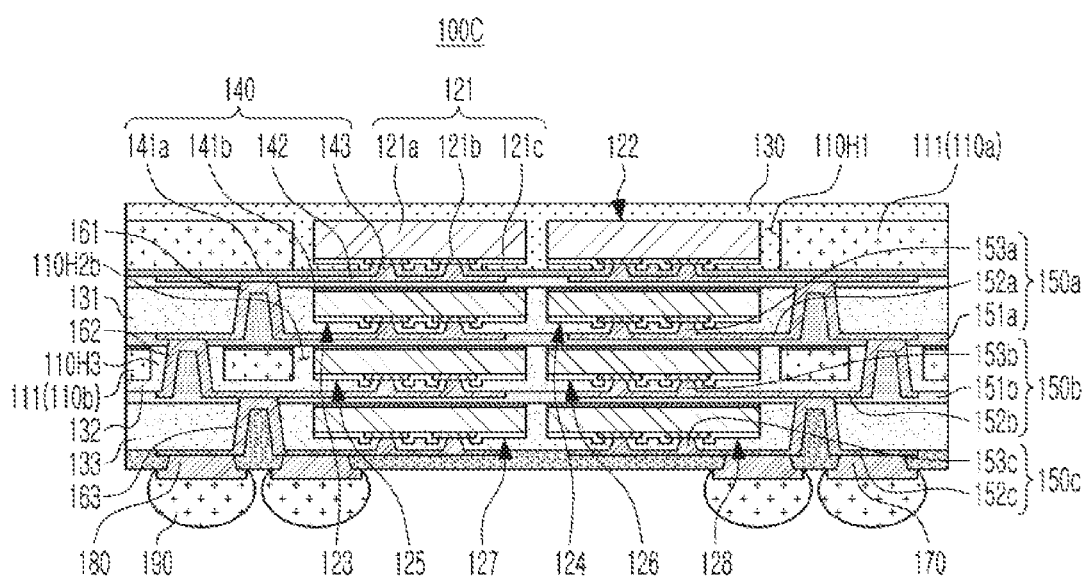
FIG. 12 is a schematic cross-sectional view of a fan-out semiconductor package according to another embodiment.

FIG. 12 is a schematic cross-sectional view of a fan-out semiconductor package according to another embodiment.

Referring to the drawing, a fan-out semiconductor package 100C according to another embodiment may be configured in such a way that first and second semiconductor chips 121 and 122 are arranged side-by-side in the first through-hole 110H1 of the first core member 110a. The first connection member 140 may be arranged in such a way that third and fourth semiconductor chips 123 and 124 are adhered side-by-side using the adhesive member 125 or the like. The second connection member 150a may be configured in such a way that fifth and sixth semiconductor chips 125 and 126 are adhered side-by-side using the adhesive member 125 or the like. The second core member 110b may also be adhered to the second connection member 150a and the fifth and sixth semiconductor chips 125 and 126 may be arranged in the second through-hole 110H2 of the second core member 110b. The third connection member 150b may be arranged in such a way that seventh and eighth semiconductor chips 127 and 128 are adhered side-by-side using the adhesive member 125 or the like. The connection pads 121b of each of the semiconductor chip 121, 122, 123, 124, 125, 126, 127, and 128 may be redistributed by the redistribution layers 142, 152a, 152b, and 152c. A description of other components and manufacturing methods are substantially the same as the above description of the fan-out semiconductor package 100A according to the aforementioned example and, thus, is omitted herein.

Figure 13:
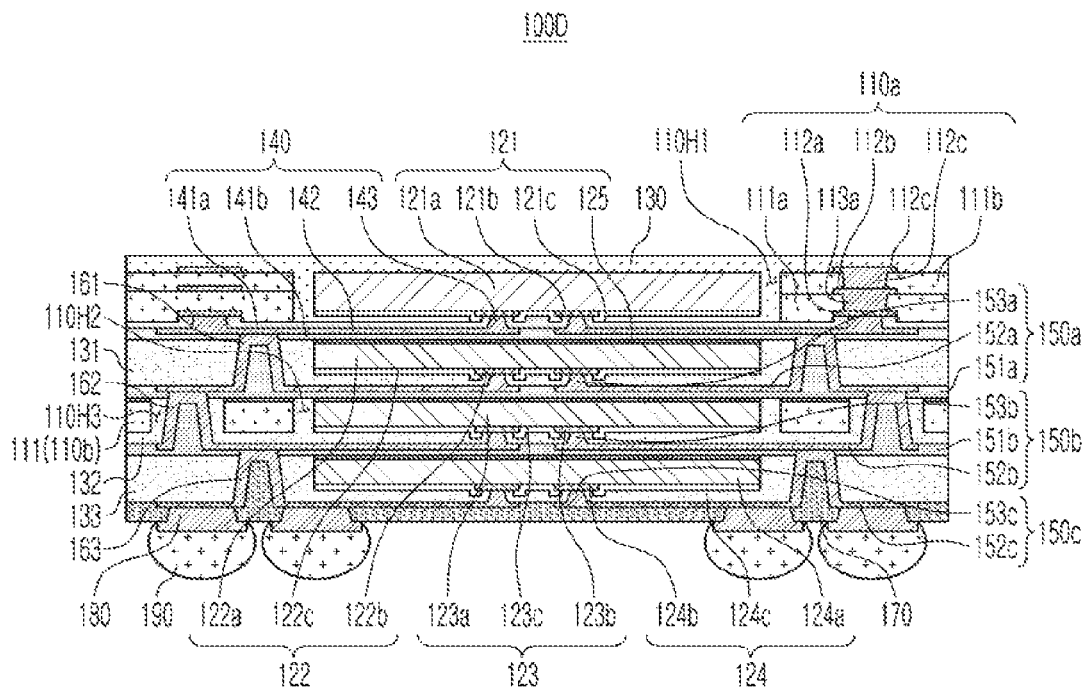
FIG. 13 is a schematic cross-sectional view of a fan-out semiconductor package according to another embodiment.

FIG. 13 is a schematic cross-sectional view of a fan-out semiconductor package according to another embodiment.

Referring to the drawing, the fan-out semiconductor package 100C according to another embodiment may include the first core member 110a, a first core insulating layer 111a that contacts the first connection member 140, a first wiring layer 112a that contacts the first connection member 140 and is embedded in the first core insulating layer 111a, a second wiring layer 112b arranged at an opposite side to the side in which the first wiring layer 112a of the first core insulating layer 111a is embedded, a second core insulating layer 111b disposed on the first core insulating layer 111a and covering the second wiring layer 112b, and a third wiring layer 112c disposed on the second core insulating layer 111b. The first to third wiring layers 112a, 112b, and 112c may be electrically connected to the connection pad 122b. The first and second wiring layers 112a and 112b and the second and third wiring layers 112b and 112c may be electrically connected through the first and second core vias 113a and 113b penetrating through the first and second insulating layers 111a and 111b, respectively.

When the first wiring layer 112a is embedded in the first core insulating layer 111a, a step generated by a thickness of the first wiring layer 112a may be minimized and, thus, an insulating distance of the first connection member 140 may be constant. That is, a distance between a lower surface of the first core insulating layer 111a and the first redistribution layer 142 of the first connection member 140 and a distance to the first connection pads 121b of the first semiconductor chip 121 from the first redistribution layer 142 of the first connection member 140 may be smaller than a thickness of the first wiring layer 112a. Accordingly, a high-density wiring of the first connection member 140 may be easily designed.

A lower surface of the first wiring layer 112a of the first core member 110a may be disposed on a level above a lower surface of the first connection pads 121b of the first semiconductor chip 121. A distance between the first redistribution layer 142 of the first connection member 140 and the first wiring layer 112a of the first core member 110a may be greater than a distance between the first redistribution layer 142 of the first connection member 140 and the first connection pads 121b of the first semiconductor chip 121. This is because the first wiring layer 112a may be recessed in the first core insulating layer 111a. As such, when the first wiring layer 112a is recessed in the first core insulating layer 111a and a lower surface of the first core insulating layer 111a and a lower surface of the first wiring layer 112a have a step therebeween, a phenomenon in which a material of the first encapsulant 130 bleeds to pollute the first wiring layer 112a may be prevented. The second wiring layer 112b of the first core member 110a may be positioned between the active surface and the non-active surface of the first semiconductor chip 121. The first core member 110a may be formed to a thickness corresponding to a thickness of the first semiconductor chip 121 and, accordingly, the second wiring layer 112b formed in the first core member 110a may be arranged at a level between the active surface and the non-active surface of the first semiconductor chip 121.

A thickness of the wiring layers 112a, 112b, and 112c of the first core member 110a may be greater than a thickness of the first redistribution layer 142 of the first connection member 140. The first core member 110a may have a thickness equal to or greater than that of the first semiconductor chip 121 and, thus, the wiring layers 112a, 112b, and 112c may also be formed with a relatively large size depending on a scale thereof. On the other hand, the first redistribution layer 142 of the first connection member 140 may be formed with a relatively small size than the wiring layers 112a, 112b, and 112c for thinning.

A material of the core insulating layers 111a and 111b is not particularly limited. For example, an insulating material may be used. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a photo imagable dielectric (PID) resin may also be used.

The wiring layers 112a, 112b, and 112c may redistribute the first connection pads 121b of the first semiconductor chip 121. A material of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include a via pad, a wire pad, a connection terminal pad, or the like.

The core vias 113a and 113b may electrically connect the wiring layers 112a, 112b, and 112c formed at different layers and, accordingly, an electrical path may be formed in the first core member 110a. A material of the core vias 113a and 113b may also be a conductive material. The core vias 113a and 113b may be completely filled with a conductive material or the conductive material may also be formed along a wall of each of via holes. The core vias 113a and 113b may have any shape such as a cylindrical shape as well as a tapered shape. When a hole for the first core via 113a is formed, some pads of the first wiring layer 112a may function as a stopper and, thus, it is advantageous when the first core via 113a has a tapered shape in which a width of an upper surface is greater than a lower surface in terms of a process. In this case, the first core via 113a may be integrated with a pad pattern of the second wiring layer 112b. When a hole for the second core via 113b is formed, some pads of the second wiring layer 112b may function as a stopper and, thus, it is advantageous when the second core via 113b has a tapered shape in which a width of an upper surface is greater than a lower surface in terms of a process. In this case, the second core via 113b may be integrated with a pad pattern of the third wiring layer 112c.

Other components, for example, the description of the second core member 110b of FIG. 9, etc. may also be applied to a fan-out semiconductor package 100D according to another embodiment and a detailed description thereof is substantially the same as the aforementioned fan-out semiconductor package 100A and, thus, is omitted herein. In particular, in some embodiments, the second core member 110b may also have the same structure as the first core member 110a.

Figure 14:
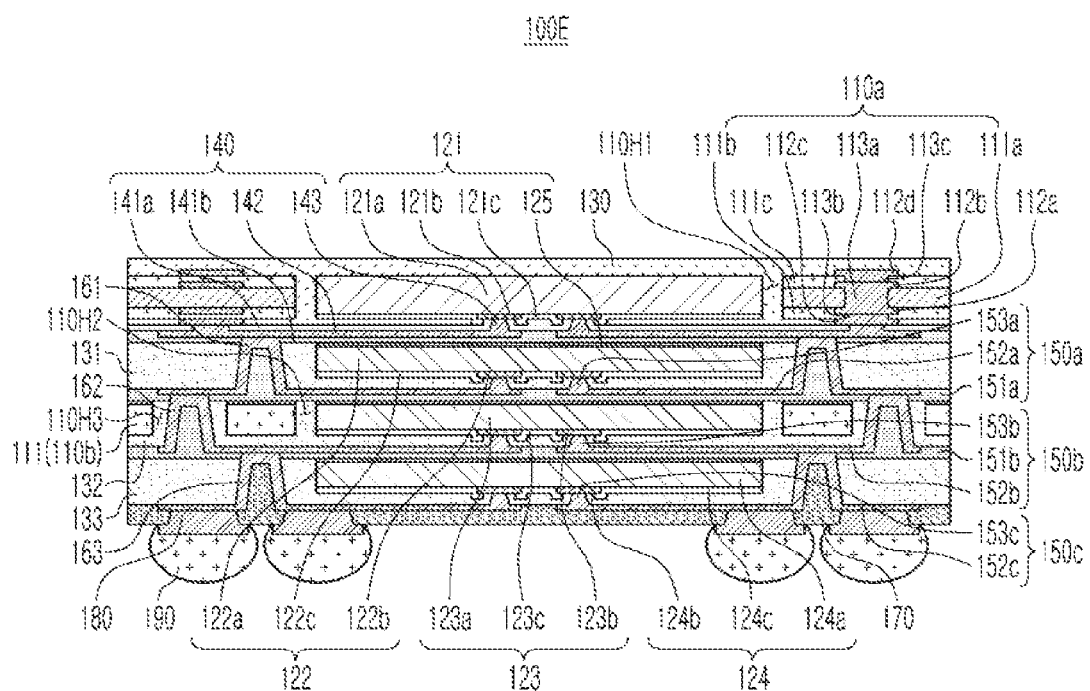
FIG. 14 is a cross-sectional view of a fan-out semiconductor package according to another embodiment.

FIG. 14 is a cross-sectional view of a fan-out semiconductor package according to another embodiment.

Referring to the drawing, a fan-out semiconductor package 100E according to another embodiment may include the first core member 110a, the first core insulating layer 111a, the first wiring layer 112a and the second wiring layer 112b arranged on opposite surfaces of the first core insulating layer 111a, the second core insulating layer 111b disposed on the first insulating layer 112a) and covering the first wiring layer 112a, the third redistribution layer 112c disposed on the second core insulating layer 111b, the third core insulating layer 111c disposed on the first core insulating layer 111a and covering the second wiring layer 112b, and the fourth redistribution layer 112d arranged on the third core insulating layer 111c. The first to fourth wiring layers 112a, 112b, 112c, and 112d may be electrically connected to the first connection pads 121b. The first core member 110a may include a larger number of the wiring layers 112a, 112b, 112c, and 112d to more simplify the first connection member 140. Accordingly, yield degradation due to failure during formation of the first connection member 140 may be overcome. The first to fourth wiring layers 112a, 112b, 112c, and 112d may be electrically connected through the first to third core vias 113a, 113b, and 113c penetrating through the first to third core insulating layers 111a, 111b, and 111c, respectively.

The first core insulating layer 111a may have a larger thickness than a thickness of the second core insulating layer 111b and the third core insulating layer 111c. The first core insulating layer 111a may have a relatively great thickness to basically maintain rigidity and the second core insulating layer 111b and the third core insulating layer 111c may be introduced to form a larger number of the wiring layers 112c and 112d. The first core insulating layer 111a may include a different insulating material from the second core insulating layer 111b and the third core insulating layer 111c. For example, the first core insulating layer 111a may be, for example, prepreg including a core material, a filler, and an insulating resin, and the second core insulating layer 111b and the third core insulating layer 111c may be an ABF film or a PID film including a filler and an insulating resin but the present disclosure is not limited thereto. Similarly, the first core via 113a penetrating through the first core insulating layer 111a may have a diameter greater than those of the second and third vias 113b and 113c each penetrating through the second and third core insulating layers 111b and 111c.

A lower surface of the third wiring layer 112c of the first core member 110a may be disposed on a level below a lower surface of the first connection pads 121b of the first semiconductor chip 121. In addition, a distance between the first redistribution layer 142 of the first connection member 140 and the third wiring layer 112c of the first core member 110a may be smaller than that between the first redistribution layer 142 of the first connection member 140 and the first connection pads 121b of the first semiconductor chip 121. The reason is that the third wiring layer 112c may be disposed on the second core insulating layer 111b in a protruding form, resulting in being in contact with the first connection member 140. The first wiring layer 112a and the second wiring layer 112b of the first core member 110a may be disposed on a level between an active surface and a non-active surface of the first semiconductor chip 121. The first core member 110a may be formed to correspond to a thickness of the first semiconductor chip 121 and, thus, the first wiring layer 112a and the second wiring layer 112b formed in the first core member 110a may be arranged at a level between the active surface and the non-active surface the first semiconductor chip 121.

A thickness of the wiring layers 112a, 112b, 112c, and 112d of the first core member 110a may be greater than that of the first redistribution layer 142 of the first connection member 140. The first core member 110a may have a thickness equal to or greater than a thickness of the first semiconductor chip 121 and, thus, the wiring layers 112a, 112b, 112c, and 112d may also be formed with a relatively large size. On the other hand, the first redistribution layer 142 of the first connection member 140 may be formed with a relatively small size for thinning.

Other components, for example, the description of the second core member 110b of FIG. 9, etc. may also be applied to the fan-out semiconductor package 100E according to another embodiment and a detailed description thereof is substantially the same as the aforementioned fan-out semiconductor package 100A and, thus, is omitted herein.

As set forth above, according to the exemplary embodiment in the present disclosure, a fan-out semiconductor package may be capable of being thinned and may have high capability to have enhanced reliability even if a plurality of semiconductor chips are used as one effect of various effects according the present disclosure.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

What is claimed is:

1. A fan-out semiconductor package comprising:
a first core member including a first through-hole;
a first semiconductor chip disposed in the first through-hole of the first core member and including a first active surface with a first connection pad disposed thereon and a first non-active surface opposing the first active surface;
a first encapsulant configured to encapsulate at least a portion of the first semiconductor chip;
a first connection member disposed on the first active surface of the first semiconductor chip and including a first via and a first redistribution layer electrically connected to the first connection pad through the first via;
a second core member adhered to a lower surface of the first connection member and including a second through-hole;
a second semiconductor chip disposed in the second through-hole of the second core member and including a second active surface with a second connection pad disposed thereon and a second non-active surface opposing the second active surface;
a second encapsulant configured to encapsulate the second semiconductor chip, the second core member, and the first connection member;
a second connection member disposed on the second active surface of the second semiconductor chip and including a second via and a second redistribution layer, electrically connected to the second connection pad through the second via; and
a connection via penetrating through the second core member and configured to electrically connect the first redistribution layer and the second redistribution layer,
wherein the first encapsulant covers the first non-active surface of the first semiconductor chip and the second encapsulant covers a portion of the second active surface of the second semiconductor chip.

2. The fan-out semiconductor package of claim 1, wherein the second core member further includes a via through-hole with the connection via disposed therein; and
wherein the connection via penetrates through the second encapsulant in the via through-hole.

3. The fan-out semiconductor package of claim 1, wherein the second core member and the second non-active surface of the second semiconductor chip are adhered to the first connection member using a die attach film (DAF) as a medium.

4. The fan-out semiconductor package of claim 1, wherein the connection via has a greater diameter than the first and second vias.

5. The fan-out semiconductor package of claim 1, wherein the connection via has a tapered shape with a lower diameter greater than an upper diameter.

6. The fan-out semiconductor package of claim 1, wherein the first connection pad connected to the first via is redistributed externally of the first semiconductor chip through the first redistribution layer; and wherein the second connection pad connected to the second via is redistributed externally of the second semiconductor chip through the second redistribution layer.

7. The fan-out semiconductor package of claim 1, wherein the first core member includes a first core insulating layer, a first wiring layer contacting the first connection member and embedded in the first core insulating layer, and a second wiring layer disposed at an opposite side of the first core insulating layer to a side in which the first wiring layer is embedded; and
wherein the first and second wiring layers are electrically connected to the first connection pad.

8. The fan-out semiconductor package of claim 1, wherein the first core member includes a first core insulating layer, and a first wiring layer and a second wiring layer that are arranged on opposite surfaces of the first core insulating layer, respectively; and
wherein the first and second wiring layers are electrically connected to the first connection pad.

9. A fan-out semiconductor package comprising:
a first core member including a first through-hole;
a first semiconductor chip disposed in the first through-hole of the first core member and including a first active surface with a first connection pad disposed therein and a first non-active surface opposing the first active surface;
a first encapsulant configured to encapsulate at least a portion of the first semiconductor chip;
a first connection member disposed on the first active surface of the first semiconductor chip and including a first via and a first redistribution layer electrically connected to the first connection pad through the first via;
a second semiconductor chip disposed below the first connection member and including a second active surface with a second connection pad disposed thereon and a second non-active surface opposing the second active surface;
a second encapsulant configured to encapsulate the second semiconductor chip and the first connection member;
a second connection member disposed on the second active surface of the second semiconductor chip and including a second via and a second redistribution layer, electrically connected to the second connection pad through the second via;
a first connection via penetrating through the second encapsulant and electrically connecting the first redistribution layer and the second redistribution layer;
a second core member disposed below the second connection member and including a second through-hole;
a third semiconductor chip disposed in the second through-hole of the second core member and including a third active surface with a third connection pad disposed thereon and a third non-active surface opposing the third active surface;
a third encapsulant configured to encapsulate the third semiconductor chip, the second core member, and the second connection member;
a third connection member disposed on the third active surface of the third semiconductor chip and including a third via and a third redistribution layer electrically connected to the third connection pad through the third via; and a second connection via penetrating through the second core member and electrically connecting the second redistribution layer and the third redistribution layer.

10. The fan-out semiconductor package of claim 9, wherein the first and second core members are formed of a different material from the second encapsulant.

11. The fan-out semiconductor package of claim 10, wherein the first and second core members are formed of the same material.

12. The fan-out semiconductor package of claim 9, wherein the first encapsulant covers the first non-active surface of the first semiconductor chip, the second encapsulant covers the second active surface of the second semiconductor chip, and the third encapsulant covers the third active surface of the third semiconductor chip.

13. The fan-out semiconductor package of claim 9, wherein the first and second connection vias are arranged below the first core member in an external region of the second and third semiconductor chips, respectively.

14. The fan-out semiconductor package of claim 13, wherein the first and second connection vias are arranged at different positions on a plane.

15. The fan-out semiconductor package of claim 13, wherein the first and second connection vias are stacked in one line in a stack direction of the first to third semiconductor chips.

16. A fan-out semiconductor package, comprising:
a first connection member comprising a first insulating layer, a first redistribution layer disposed on the first insulating layer, a second insulating layer disposed on the first redistribution layer, and a first via connected to the first redistribution layer and penetrating through the first insulating layer;
a first semiconductor chip having a first active surface with first connection pads disposed thereon and a first non-active surface opposing the first active surface, the first semiconductor chip being disposed on the first insulating layer of the first connection member such that the first active surface faces the first insulating layer and the first connection pads are electrically connected to the first via;
a second semiconductor chip having a second active surface with second connection pads disposed thereon and a second inactive surface opposing the second active surface, the second semiconductor chip being disposed on the second insulating layer of the first connection member such that the second inactive surface faces the second insulating layer;
a second connection member comprising a second redistribution layer and a second via, the second connection member being disposed on the second active surface of the second semiconductor chip such that the second via electrically connects the second connection pads to the second redistribution layer;
a first core member having a first through-hole disposed on the first insulating layer of the first connection member such that the first semiconductor chip is disposed in the first through-hole;
a first encapsulant configured to encapsulate at least a portion of the first semiconductor chip; and
a second substrate surrounding the second semiconductor chip and having a first connection via penetrating through the second substrate and electrically connecting the first redistribution layer and the second redistribution layer.

17. The fan-out semiconductor package of claim 16, wherein the first core member comprises an unclad laminate.

18. The fan-out semiconductor package of claim 16, wherein the second substrate is a second core member having a second through-hole and disposed on the second insulating layer of the first connection member such that the second semiconductor chip is disposed in the second through-hole.

19. The fan-out semiconductor package of claim 18, wherein the second core member is an unclad laminate.

20. The fan-out semiconductor package of claim 16, wherein the second substrate is a second encapsulant configured to encapsulate the second semiconductor chip and the first connection member.

21. The fan-out semiconductor package of claim 16, further comprising
a third semiconductor chip having a third active surface with third connection pads disposed thereon and a third inactive surface opposing the third active surface, the third semiconductor chip being disposed on the second connection member on a side opposite the side on which the second semiconductor chip is disposed such that the third inactive surface faces the second connection member;
a third connection member comprising a third redistribution layer and a third via, the third connection member being disposed on the third active surface of the third semiconductor chip such that the third via electrically connects the third connection pads to the third redistribution layer;
a third substrate surrounding the third semiconductor chip and having a second connection via penetrating through the third substrate and electrically connecting the second redistribution layer and the third redistribution layer.

22. The fan-out semiconductor package of claim 21, wherein the third substrate is a third core member having a third through-hole and disposed on the second connection member such that the third semiconductor chip is disposed in the third through-hole.

23. The fan-out semiconductor package of claim 22, wherein the third core member comprises an unclad laminate.

24. The fan-out semiconductor package of claim 21, wherein the second substrate is a second encapsulant configured to encapsulate the second semiconductor chip and the first connection member, and the third substrate is a third core member comprising an unclad laminate.

* * * * *